(12) United States Patent
Raguin et al.

(10) Patent No.: US 6,410,213 B1
(45) Date of Patent: *Jun. 25, 2002

(54) METHOD FOR MAKING OPTICAL MICROSTRUCTURES HAVING PROFILE HEIGHTS EXCEEDING FIFTEEN MICRONS

(75) Inventors: Daniel H. Raguin, Spencerport; G. Michael Morris, Faiport; Peter M. Emmel, Pittsford, all of NY (US)

(73) Assignee: Corning Incorporated, Rochester, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/094,340

(22) Filed: Jun. 9, 1998

(51) Int. Cl.⁷ .................................. G03F 7/20
(52) U.S. Cl. ................. 430/321; 430/323; 430/396; 430/945
(58) Field of Search ................. 430/321, 323, 430/396, 945

(56) References Cited

U.S. PATENT DOCUMENTS

| | | | |
|---|---|---|---|
| 5,004,673 A | 4/1991 | Vlannes | 430/325 |
| 5,011,254 A | 4/1991 | Edwards | 350/96.18 |
| 5,155,631 A | 10/1992 | Snyder | 359/708 |
| 5,218,471 A | 6/1993 | Swanson | 359/565 |
| 5,286,338 A | 2/1994 | Feldblum | 156/643 |
| 5,298,366 A | 3/1994 | Iwasaki | 430/321 |
| 5,310,623 A | 5/1994 | Gal | 430/321 |
| 5,392,157 A * | 2/1995 | Shih | 359/281.1 |
| 5,455,879 A | 10/1995 | Modavis | 385/33 |
| 5,482,800 A | 1/1996 | Gal | 430/5 |
| 5,694,246 A | 12/1997 | Aoyama | 359/619 |
| 5,718,830 A | 2/1998 | Hlinka | 216/26 |
| 5,830,605 A * | 11/1998 | Umeki | 430/5 |
| 5,998,096 A * | 12/1999 | Umemoto | 430/281.1 |

OTHER PUBLICATIONS

M. T. Gale, "Direct Writing of Continuous–relief Micro–optics," *Micro–Optics: Elements, Systems, and Applications*, ed. by H. P. Herzig (Taylor & Francis Inc., Bristol, PA, 1997), pp. 53–85, 87–177.

H. Andersson, M. Ekberg, S. Hård, S. Jacobsson, M. Larsson, and T. Nilsson, "Single photomask, multilevel kinoforms in quartz and photoresist: manufacture and evaluation," *Appl. Opt.* 29, pp. 4259–4267 (1990).

(List continued on next page.)

Primary Examiner—Mark F. Huff
Assistant Examiner—Nicole Barreca
(74) Attorney, Agent, or Firm—Nixon Peabody LLP; Thomas W. Cole

(57) ABSTRACT

Fabrication of arbitrary profile micro-optical structures (lenses, gratings, etc.) and, if desired, with optomechanical alignment marks simultaneously during fabrication is based upon the use of low-contrast photosensitive material that, when exposed to a spatially variable energy dosage of electromagnetic radiation, can be processed to achieve multi-level or continuous surface-relief microstructures. By varying the exposure dose spatially based upon predetermined contrast curves of the photosensitive material, arbitrary one-dimensional (1-D) or two-dimensional (2-D) surface contours, including spherical, aspherical, toroidal, hyperbolic, parabolic, and ellipsoidal, can be achieved with surface sags greater than 15 $\mu$m. Surface profiles with advanced phase correction terms (e.g., Zernike polynomials) can be added to increase the alignment tolerance and overall system performance of the fabricated structure can also be fabricated. The continuous-relief pattern can be used as is in the photosensitive material, transferred into the underlying substrate through an etch process, electroformed into a metal, or replicated into a polymer.

14 Claims, 21 Drawing Sheets

OTHER PUBLICATIONS

S. C. Baber, "Application of high resolution laser writers to computer generated holograms and binary diffractive optics," *Holographic Optics: Optically and Computer Generated*, SPIE Proc. 1052, 66–76 (1989).

D. Daly, R. F. Stevens, M. C. Hutley, and N. Davies, "The manufacture of microlenses by melting photresist," *Meas. Sci. Technol.* 1, 759–766 (1990).

M. T. Gale, M. Rossi, J. Pedersen, H. Schütz, "Fabrication of continuous–relief microoptical elements by direct laser writing in photoresist," *Opt. Eng.* 33, 3556–3566 (1994).

E. J. Gratrix, "Evolution of a microlens surface under etching conditions," *Proc. SPIE* 1992, pp. 266–274 (1993).

H. Hisakuni and K. Tanaka, "Optical fabrication of microlenses in chalcogenide glasses," *Opt. Lett.* 20, 958–960 (1995).

M. C. Hutley, "Optical techniques for the generation of microlens arrays," *J. of Mod. Opt.* 37, 253–265 (1990).

E. Jäger, J. Hoβfeld, Q. Tang, T. Tschudi, "Design of a laser scanner for kinoform fabrication," *Holographic Optics II: Principles and Applications, SPIE Proc.* 1136, 228–235 (1989).

T. Jay and M. Stern, "Preshaping photoresist for refractive microlens fabrication," *Opt. Eng.* 33, 3552–3555 (1994).

Z. L. Liau, V. Diodiuk, J. N. Walpole, and D. E. Mull, "Large–numerical–aperture InP lenslets by mass transport," *Appl. Phys. Lett.* 52, 1859–1861 (1988).

Z. L. Liau, D. E. Mull, C. L. Dennis, R. C. Williamson, and R. G. Waarts, "Large–numerical–aperture microlens fabrication by one-step etching and mass–transport smoothing," *Appl. Phys. Lett.* 64, 1484–1486 (1994).

H. Ming, Y. Wu, J. Xie, and Toshinori Nakajima, "Fabrication of holographic microlenses using a deep UV lithographed zone plate," *Appl. Opt.* 29, 5111–5114 (1990).

M. E. Motamedi, "Micro–opto–electro–mechanical systems," *Opt. Eng.* 33, 3505–3517 (1994).

Z.D. Popovic, R. A. Sprague, and G. A. Neville Connell, "Technique for monolithic fabrication of microlens arrays," *Appl. Opt.* 27, 121–1284 (1988).

G. Przyrembel, "Fabricating spherical microlens arrays with a two step laser beam writing technique," *SPIE Proc.* 2152, 314–320 (1994).

M. B. Stern and T. R. Jay, "Dry etching for coherent refractive microlens arrrays," *Opt. Eng.* 33, pp. 3547–3551 (1993).

J. S. Swenson, Jr., R. A. Fields, and M. H. Abraham, "Enhanced mass–transport smoothing of f/0.7 GaP microlenses by use of sealed ampoules," *Appl. Phys. Lett.* 66, 1304–1306 (1995).

D. C. O'Shea and W. S. Rockward, "Gray–scale masks for diffractive–optics fabrication; I. Commercial slide imagers," i *Appl. Opt.* 34, 7507–7517 (1995).

D. C. O'Shea and W. S. Rockward, "Gray–scale masks for diffractive–optics fabrication: II. Spatially filtered halftone screens," *Appl. Opt.* 34, 7518–7526 (1995).

W. Daschner, P. Long, R. Stein, C. Wu, and S. H. Lee, "Cost–effective mass fabriction of multilevel diffractive optical elements by use of a single optical exposure with a grayscale mask on high–energy beam–sensitive glass," *Appl. Opt.* 36, 4675–4680 (1997).

M. B. Stern, "Chapter 3: Binary Optics Fabrication," in *Micro–Optics: Elements, Systems, and Applications*, ed. H. P. Herzig, (Taylor & Francis, Bristol PA, 1997), pp. 53–85.

M. C. Hutley, "Chapter 5: Refractive Lenslet Arrays," in *Micro–Optics: Elements, Systems, and Applications*, ed. by H. P. Herzig, (Taylor & Francis, Bristol, PA 1997), pp. 127–150.

L. d'Auria, J. P. Huignard, A. M. Roy, and E. Spitz, "Photolithographic fabrication of thin film lenses," *Opt. Commun.* 5, pp. 232–235 (1972).

* cited by examiner

METHOD FOR MAKING OPTICAL MICROSTRUCTURES HAVING PROFILE HEIGHTS EXCEEDING FIFTEEN MICRONS

FIELD OF THE INVENTION

This invention relates to methods for producing micro-optical structures, for use as optical elements, such as lenses and gratings, with arbitrary (essentially any) surface-relief profile and, if desired, with optomechanical alignment marks.

Briefly, the invention is carried out by varying the exposure dose, spatially, based upon predetermined contrast curves of a low-contrast photosensitive material. Arbitrary one-dimensional (1-D) or two-dimensional (2-D) surface contours including spherical, aspherical, toroidal, hyperbolic, parabolic, and ellipsoidal can be achieved. The final medium for the fabricated microstructures can be a wide range of materials through the use of etching and replication technology. The method is adapted to mass production. Applications for this invention include, but are not limited to, and particularly the manufacture of microstructures for use in the fields of optical communications, optical data storage, optical interconnects, telecommunications, and in displays, and focal-plane arrays.

This invention is related to the invention described in U.S. patent application, Ser. No. 09/0905,300, filed Jun. 10, 1998 now U.S. Pat. No. 6,075,650, issue Jun. 13, 2000.

BACKGROUND

A microlens or microcylinder imparts a given phasefront to incident radiation. Similar to macroscopic optical systems, these micro-optical elements can focus incident radiation, diverge the radiation, as well as impart a phase function to correct aberrations from previous elements in the system, or precorrect for aberrations occurring downstream of the microelements. There are numerous methods of fabricating surface-relief micro-optics, and these include multi-step mask and etching, resist thermal transport, e-beam exposure, laser ablation, stamping, etc. The present invention offers advantages over all of these described processes, due to the precision control one has over the final surface shape of the micro-optical element, and in providing optical microstructures having profiles with heights exceeding 15 µm (microns) which in lenses is called a deep sag.

Previous methods of fabrication of elements using exposures of photoresist either concentrated upon fabricating binary (two-level) structures, such as in the case of micro electro-mechanical systems (MEMS), or exposed photoresist to a varying dosage of exposure radiation using thin photoresist. Photoresist has been exposed to create continuous-relief photoresist profiles of optical devices (e.g., microlenses, diffractive phase plates, and diffraction gratings). Exposure methods have included laser pattern generation, see, T. R. Jay and M. B. Stern M. T. Gale, M. Rossi, J. Pedersen, H. Schütz, "Fabrication of continuous-relief micro-optical elements by direct laser writing in photoresist," *Opt. Eng.* 33, 3556–3566 (1994), grayscale mask exposures, see, H. Andersson, M. Ekberg, S. Hård, S. Jacobsson, M. Larsson, and T. Nilsson, "Single photomask, multilevel kinoforms in quartz and photoresist: manufacture and evaluation," *Appl. Opt.* 29, pp. 4259–4267 (1990); D. C. O'Shea and W. S. Rockward, "Gray-scale masks for diffractive-optics fabrication: I. Commercial slide imagers," *Appl. Opt.* 34, 7507–7517 (1995); D. C. O'Shea and W. S. Rockward, "Gray-scale masks for diffractive-optics fabrication: II. Spatially filtered halftone screens," *Appl. Opt.* 34, 7518–7526 (1995); W. Daschner, P. Long, R. Stein, C. Wu, and S. H. Lee, "Cost-effective mass fabrication of multilevel diffractive optical elements by use of a single optical exposure with a grayscale mask on high-energy beam-sensitive glass," *Appl. Opt.* 36, 4675–4680 (1997), and holographically, M. C. Hutley, "Optical techniques for the generation of microlens arrays," *J. of Mod. Opt.* 37, 253–265 (1990); H. Ming, Y. Wu, J. Xie, and Toshinori Nakajima, "Fabrication of holographic microlenses using a deep UV lithographed zone plate," *Appl. Opt.* 29, 5111–5114 (1990). But the present invention overcomes limitations of prior processes in affording arbitrary micro-structure profiles, especially with heights (sag in case of lenses) exceeding 15 µm.

In the multi-step mask and etch process, as described in M. B. Stern, "Chapter 3: Binary Optics Fabrication," in *Micro-Optics: Elements, Systems, and Applications*, ed. H. P. Herzig, (Taylor & Francis, Bristol, Pa., 1997), pp. 53–85, one exposes a photosensitive material (typically photoresist developed for the semiconductor industry) using a binary amplitude mask. This mask consists of a series of optically opaque and clear features (e.g., Chromium on glass) that is used to selectively expose selected areas of a photoresist-coated substrate to electromagnetic radiation. After development, one achieves a binary structure in the photoresist that can be transferred into the underlying substrate material through an etching process. This exposure, development and etching process can be repeated with a series of different photomasks in order to achieve a multi-level surface-relief pattern. Although of practical use for the fabrication of diffraction gratings and phase plates, the multi-step masks and etch process has disadvantages when the fabrication of deep-sag or high numerical aperture (NA) micro-optical elements is required. For a diffraction grating fabricated with a multi-level process operating at the order m, the maximum theoretical diffraction efficiency ($\eta_m$) attainable is given by $$\eta_m = \mathrm{sinc}^2(m/p) = \left[\frac{\sin(\pi m/p)}{\pi m/p}\right]^2, \qquad (1)$$

where p is the number of levels of the structure. Therefore, one notes that if a structure is blazed for $1^{st}$ order (phase depth of $2\pi n$ and constructed with 16 levels, the diffraction efficiency one can theoretically achieve is 98.7%. Likewise if a structure is blazed for $2^{nd}$ order (phase depth of $4\pi$) and constructed with 32 levels, the diffraction efficiency one can achieve is also 98.7%. In other words, if a multi-level profile is such that each level represents $\pi/8$ phase, the efficiency is 98.7%. Similarly, if each level of the structure translates to $\pi/4$ or $\pi/2$ phase, the efficiency drops to 95.0% and 81.1%, respectively. To first-order, one can determine the efficiency of a multi-level microlens structure using Eq. (1) for a diffractive structure. For a surface-relief structure with a refractive index of 1.5 operating at the telecommunications wavelength of 1.3 µm, a physical depth of 2.6 µm corresponds to a phase depth of $2\pi$ according to $$\phi = \frac{2\pi}{\lambda}d(n-1), \qquad (2)$$

where $\phi$ is the phase depth, d is the relief depth, $\lambda$ is the operating wavelength and n is the index of refraction of the substrate material (air is assumed to be the second medium). Therefore, if one has a microlens that requires a sag of 10.4 µm, the phase depth is 8 µn. With a 16-level structure, the element will only be 81% efficient at best (assuming no fabrication errors).

Such a microlens with additional levels in order to increase the optical efficiency, is impractical to attain. For a 99 percent efficient f/3 microlens operating at λ=1.3 μm, the critical dimension (CD) of the surface features required is approximately 0.5 μm. This CD offers an extreme challenge in terms of achieving such features, let alone the mask-to-mask alignment tolerances required (generally one quarter of the CD). Since microlenses required for telecommunications and optical data storage can require f/2 and f/1 optical speeds, the use of multi-level mask and etch technology is therefore impractical for achieving the majority of the optical elements required.

Laser pattern generators, which have been proposed, have emphasized the production of binary masks. See, for example, S. Charles Baber, "Application of high resolution laser writers to computer generated holograms and binary diffractive optics," *Holographic Optics: Optically and Computer Generated*, SPIE Proc.1052 66–76 (1989); E. Jäger, J. Hoβfeld, Q. Tang, T. Tschudi, "Design of a laser scanner for kinofrom fabrication," *Holographic Optics II: Principles and Applications*, SPIE Proc. 1136, 228–235 (1989). Laser pattern generators for making diffractive kinoforms are described in M. T. Gale, M. Rossi, J. Pedersen, H. Schütz, "Fabrication of continuous-relief micro-optical elements by direct laser writing in photoresist," *Opt. Eng.* 33, 3556–3566 (1994).

Laser pattern generators have been proposed to expose photoresist in a point-by-point fashion with variable exposure doses, see, for example, M. T. Gale, M. Rossi, J. Pedersen, H. Schütz, "Fabrication of continuous-relief micro-optical elements by direct laser writing in photoresist," *Opt. Eng.* 33, 3556–3566 (1994) to achieve continuous-relief microstructures. Likewise, proposed has been the use of grayscale mask lithography to produce continuous-relief profiles in photoresist, see Vlannes, U.S. Pat. No. 5,004,673; G. Gal, U.S. Pat. No. 5,310,623, and a U.S. Pat. No. 5,482,000 to G. Gal.

The present invention improves upon prior LPG methods even for the fabrication of diffractive elements, by patterning of photoresist with a blazed multi-level or continuous profiles and with depths exceeding 15 μm. Prior to the present invention, no one had fabricated continuous-relief microlenses using a variable exposure dosage that resulted in microstructures with surface sags exceeding 15 μm.

Using thermal transport mechanisms to fabricate micro-optical components, one takes a pre-patterned surface relief structure, and through the introduction of heat above the thermal glass transition temperature of the material ($T_g$) the structure is melted into a spherical or cylindrical profile by surface-tension effects. Initially most thermal transport work was performed with binary patterned photoresist, as described in Z. D. Popovic, R. A. Sprague, and G. A. Neville Connell, "Technique for monolithic fabrication of microlens arrays," *Appl. Opt.* 27, 1281–1284 (1988); D. Daly, R. F. Stevens, M. C. Hutley, and N. Davies, "The manufacture of microlenses by melting photoresist," *Meas. Sci. Technol.* 1, 759–766 (1990). One first exposes a substrate with photoresist, and through a binary high-contrast exposure process, patterns the photoresist into a series of cylindrical surface-relief structures. By heating the substrate using a convection oven or hot plate the photoresist can be melted. Due to surface tension, the resulting melted profile takes the form of a spherical surface. This process is conducive to the fabrication of microlenses in the f/1 to f/3 range, and is not conducive towards slower microlenses due to the tendency of the melted photoresist to sag in the middle.

The continuous-relief profile of the photoresist can be transferred into the underlying substrate material through a dry etching process, see, E. J. Gratrix, "Evolution of a microlens surface under etching conditions," *Proc. SPIE* 1992, pp. 266–274 (1993); M. B. Stern and T. R. Jay, "Dry etching for coherent refractive microlens arrays," *Appl. Opt.* 33, pp. 3547–3551 (1993). In recent years, more sophisticated methods of producing microlenses through the thermal transport scheme have been proposed. Hlinka et al, U.S. Pat. No. 5,718,830 proposed using photoresist masking and RIE etching to produce cylindrical islands in a PMMA layer that is spun onto a substrate. These cylindrical islands are then melted in order to produced the desired microlens in PMMA. A similar concept was filed in 1994 (Iwasaki et al, U.S. Pat. No. 5,298,366) that covered the use of an intermediate layer in order to transfer the cylindrical islands into a final material other than photoresist. This second material could then be thermally reflowed in order to produce the desired microlenses. Feldblum et al, U.S. Pat. No. 5,286,338 realized the deficiency of the thermal transport mechanism to produce microlenses with precision surfaces for diffraction-limited optical performance, and proposed the use of reactive ion etching to rectify the situation. One can take resist microlenses with precision surfaces for diffraction-limited optical performance, and proposed the use of reactive ion etching to rectify the situation. One can take resist microlenses produced using the thermal transport mechanism, and etch-transfer them into the underlying substrate using reactive ion etching (RIE). By changing the gas constituency of the RIE chamber during etch-transfer, one can change the etch selectivity (ratio of substrate etch rate to photoresist etch rate), and thereby modify the profile of the resultant microlenses to be closer to the desired profile than the thermal transport method alone can achieve.

Another method which has been proposed for improving the profile obtained by the thermal transfer method involves preshaping the microlens structure before melting have been implemented, including multistep, as described in D. Daly, R. F. Stevens, M. C. Hutley, and N. Davies, "The manufacture of microlenses by melting photoresist," *Meas. Sci. Technol.* 1, 759–766 (1990), and laser pattern generation, as described in T. Jay and M. Stern, "Preshaping photoresist for refractive microlens fabrication," *Opt. Eng.* 33, 3552–3555 (1994). Once preshaped, the photoresist structure is then melted to smooth the surface-relief profile.

Researchers have also patterned non-photoresist materials such as InP. GaAs, and GaP, using the thermal transport method as described in Z. L. Liau, V. Diodiuk, J. N. Walpole, and D. E. Mull, "Large-numerical-aperture InP lenslets by mass transport," Appl. Phys. Lett. 52, 1859–1861 (1988); Z. L. Liau, D. E. Mull, C. L. Dennis, R. C. Williaamson, and R. G. Waarts, "Large-numerical-aperture microlens fabrication by one-step etching and mass-transport smoothing," *Appl. Phys. Lett.* 64, 1484–1486 (1994); J. S. Swenson, Jr., R. A. Field, L. Mitt. Abraham, "Enhanced mass-transport smoothing of f/0.7 GaP microlenses by use of sealed ampoules", Appl Phys. Lett. 66 1304–1306 (1995). For the non-polymer materials, one requires several days of a controlled heating processes in special atmospheres wherein oven temperatures can reach 1000° C. For the photoresist-melting method of fabricating microstructures, the temperatures are generally in the 160–200° C. The transfer of the continuous-relief profile of the photoresist can be transferred into the underlying substrate material through a dry etching process, see, E. J. Gratrix, "Evolution of a microlens surface under etching conditions," *Proc. SPIE* 1992, pp. 266–274 (1993); M. B. Stern and T. R. Jay, "Dry etching for coherent refractive microlens arrays," *Appl. Opt.* 33, pp. 3547–3551 (1993).

A disadvantage of the thermal transport mechanism is the ability to achieve microlens arrays with a high filling factor (ratio of area taken up by the optical elements to the total area of the substrate). One requires a space between the patterned pillar area of the resist, PMMA, or other material in order for distinct structures to be defined that can be melted into shape. If the filling factor is less than 100%, this can reduce the overall efficiency of the optical system. One solution proposed by Aoyama and Shinohara, in U.S. Pat. No. 5,694,246 is to first pattern a sparse array so that the separation of microlenses is twice a given microlens diameter. After melting and fixing the material, the sparse microlens array is recoated with photoresist and patterned with a second sparse array, but this one aligned such that the cylindrical islands of the second array are positioned between the gaps of the microlenses of the first array. The second array, is then reflowed in order to produce a single microlens array with close to 100% filling factor. The disadvantages of the method proposed by Aoyama and Shinohara are the extra processing steps, and the additional precision one requires in aligning one array to a second one.

A principal disadvantage of the thermal transport method is the lack of control that one has regarding the surface-relief profile. Since the final processing step involves a thermal reflow, the shape and quality of any alignment marks simultaneously patterned onto the surface is severely limited. Therefore, sharp registration features with submicron accuracies have not been achieved.

The invention also allows for microstructures to have filling factors up to 100% without any additional processing steps. The invention enables one to simultaneously pattern alignment or registration marks. With the thermal reflow method, the shape and quality of any alignment marks simultaneously patterned onto the surface is severely limited. Therefore, sharp registration features with submicron accuracies are not possible using this thermal transport technique.

Other methods of producing microlenses have concentrated upon fabricating a microlens directly onto an optical fiber (see, for example, Edwards et al, U.S. Pat. No. 5,011,254, and Modavis and Webb, U.S. Pat. No. 5,455,879). These techniques typically involve drawing the end of the fiber, or otherwise tapering it in such a manner as to produce a surface capable of at least partially collimating or focusing the radiation being emitted by the fiber. The invention described herein does not relate to such structures. Rather it relates to a microstructured substrate that is independently fabricated (but then may be integrated onto the end of a fiber if required). The preforming of glass has been proposed to create stand-alone glass microcylinders. Snyder and Baer, U.S. Pat. No. 5,155,631, describes preforming glass such that a cylindrical lens is produced of arbitrary curvature. This cylindrical lens can be integrated into an optical system in order to collimate laser diode arrays. The present invention differs from the process described by Snyder and Baer, in that the present invention does not involve the use of heat to preform materials, and is not limited to cylindrical microstructures.

It has been proposed to use grayscale contact prints or projection printing to fabricate microstructures in photoresist. See, H. Andersson, M. Ekberg, S. Hård, S. Jacobsson, M. Larsson, and T. Nilsson, "Single photomask, multilevel kinoforms in quartz and photoresist: manufacture and evaluation," *Appl. Opt.* 29, pp. 4259–4267 (1990); D. C. O'Shea and W. S. Rockward, "Gray-scale masks for diffractive-optics fabrication: I. Commercial slide imagers," *Appl. Opt.* 34, 7507–7517 (1995); D. C. O'Shea and W. S. Rockward, "Gray-scale masks for diffractive-optics fabrication: II. Spatially filtered halftone screens," *Appl. Opt.* 34, 7518–7526 (1995); W. Daschner, P. Long, R. Stein, C. Wu, and S. H. Lee, "Cost-effective mass fabrication of multilevel diffractive optical elements by use of a single optical exposure with a grayscale mask on high-energy beam-sensitive glass," *Appl. Opt.* 36, 4675–4680 (1997). See also, M. C. Hutley, "Chapter 5: Refractive Lenslet Arrays," in *Micro-Optics: Elements, Systems, and Applications*, ed. by H. P. Herzig, (Taylor & Francis, Bristol,. Pa., 1997), pp. 127–150. The grayscale masks can also be produced using photographic slide film or through the use of high-energy beam sensitive (HEBS) glass plates. But such proposals have not been practical when micro-structure with arbitrary profiles and especially height or sags exceeding 15 µm are needed.

SUMMARY OF THE INVENTION

The fabrication method provided by the current invention enables the direct patterning of photosensitive material in accordance with a variable dose of electromagnetic radiation. The photoresist coating, exposure, and development process enable one to create surface-relief profiles of arbitrary surface micro-structure. The previous methods described above have not provided optical micro-structures having the arbitrary relief profiles and, if desired, with alignment and registration marks capable of the fabrication process of the present invention. The invention enables to the use of low-contrast photosensitive material to achieve a final structure (replicated, etch-transferred, etc.) that has a profile height (surface sag) greater than 15 µm.

In accordance with the present invention, photosensitive material is exposed to a spatially variable dose of electromagnetic energy to create a surface-relief structure upon development of the photosensitive material. The photosensitive material may be coated, onto a substrate of interest (planar or otherwise). The coating is characterized by its response curve in terms of developed relief depth to electromagnetic exposure energy and wavelength.

The invention involves the recognition that the response curve is a complex function of the material parameters as well as the method with which the coating, exposure, and development process steps are performed. For instance, the material's viscosity, in conjunction with the coating parameters (spin speed in the case of spin-coating, pull rate in the case of dip coating, etc.), will dictate the final film thickness. During exposure, the wavelength of the radiation used, in conjunction with pre-exposure procedures (such as the temperature and duration of an oven bake), complex index of refraction of the photosensitive material, and chemical compound of the material being exposed, are parameters that will dictate the sensitivity of the material, and therefore rate of development. Development procedures can also vary the response curve. Development time and development solution used also affect development rates, but so will the exact method of development. In the case of aqueous development, the response curve will change if one uses immersion, spray, or puddle methods of developing the photosensitive material. The invention is carried out by selecting, the photosensitive materials and controlling the coating, exposure, and development parameters, to achieve the precision microstructures desired.

The resulting microstructure in the photosensitive material can remain in the material, or be etch-transferred into the underlying substrate. The microstructure can also be replicated into a polymer material via a cast-and-cure, embossing, compression molding, or compression injection molding process. This enables mass production of the optical micro-structures. The disclosed manufacturing process is robust in that arbitrary surface-relief structures can be fabricated that have optical and mechanical properties of interest. Optical micro-structures of particular interest include microlenses with toroidal, elliptical, and hyperbolic surface-relief structures.

Preferably, laser pattern generation (LPG) is practiced in-accordance with this invention. One exposes photoresist using a single or multiple focused laser beam that rasters across a photosensitive substrate. There are two scanning geometries that are generally preferred: x-y scanning, where the substrate is moved on a pair of orthogonal linear stages, and r-θ scanning, where the substrate is spun on an air bearing spindle. In the x-y scan systems, the part is scanned below a single or multiple focused laser beams. For photoresist that is sensitive in the blue or UV portions of the electromagnetic spectrum, the radiation source used is typically an argon-ion, krypton-ion, or helium-cadmium laser. Semiconductor laser diodes may be used for LPGs. The invention is not limited to the source of exposure energy and other sources of electromagnetic radiation such as the LED or electron beams may be used, lasers however are now preferred. To spatially vary the exposure dose the photosensitive material is exposed to, one can vary the speed of the stages moving the focused exposure beams or the substrate. This changes the dwell time of the exposure beam. A more accurate method of controlling the exposure dosage is to vary the intensity of the writing beam or beams. Methods for accomplishing this include the use of an electro-optic or acousto-optic modulators with diode lasers, including those which may provide radiation in the blue or UV portion of the electromagnetic spectrum, the drive current of the laser can be directly modulated to vary the outputed laser beam's power. A computer desirably is used to control the modulator and computes, based upon the desired surface-relief pattern and the response curve of the photosensitive material, the modulation sequence required. After the relief pattern has been developed, the element can be used as is, or one can transfer the desired pattern into the substrate using an etch process. The patterned surface can also be used as the master element for a replication process.

With the gray-scale mask lithography method, practiced with this invention, one can expose photoresist using a mask with a transmission function T(x,y). By passing a beam of uniform or well-defined intensity variation $I_{inc}(x,y)$ through this mask, the transmitted beam can have a controlled intensity function $I_{out}(x,y)=I_{inc}(x,y)\,T(x,y)$. The intensity function can be used to expose photoresist, or any other photosensitive material once one has a well-characterized response curve for the material.

Other exposure methods of capitalizing upon this invention include the use of moving apertures and controlled diffraction effects in order to achieve the surface-relief profiles desired. With the moving aperture method, an amplitude mask is translated in front of an electromagnetic exposure beam. By choosing the amplitude distribution of the mask and the path with which the mask and/or substrate is being translated, one can control the spatial distribution of the exposure dose for a particular photosensitive material.

Another method of achieving desired surface-relief profiles is to expose a photosensitive material to the intensity of a diffracted electromagnetic (such as an optical) beam. The diffraction profile can be achieved by controlling the temporal and spatial coherence of the exposure beam, controlling the aperture shape the radiation is diffracting around, as well as the distance from the aperture the photosensitive material is set at. For instance, one can diffract or focus a beam through a pinhole in order to create an exposure dosage that is circularly symmetric but decreases radially. By tailoring the exposure profile to the response curve of the photosensitive material (and vice-versa) one can then write and develop a microlens structure. One can then translate the substrate underneath the radially symmetric exposure dose in order to achieve a cylindrical microlens.

The current invention allows one to expose arbitrary profiles. Once the response curve of a photosensitive material is characterized, then the exposure methods, such as mentioned above may be used to create the relief structures dictated by a particular optical or mechanical design. For optical applications, phase formats of interest include radially symmetric profiles, as well as non-rotationally symmetric profiles. Ray tracing programs such as Optical Research Associate's (ORA's) Code V and Sinclair Optics OSLO SIX, have different conventions in terms of how the phase of a diffractive optical element (DOE) is represented, so only the conventions used by Code V will be given for illustrative purposes. For rotationally symmetric phase plates, the phase polynomial $\phi$ (r)can be represented by $$\phi(r)=c_1 r^2+c_2 r^4+c_3 r^6+c_4 r^8+ \qquad (3)$$

To better relate such a rotationally symmetric phase profile to that of a conic constant, Code V also allows for input of the phase function according to $$\phi(r) = \frac{cr^2}{1+\sqrt{1-(1+k)c^2 r^2}} + Ar^4 + Br^6 + Cr^8 + \ldots, \qquad (4)$$

where k is the conic constant, and c is the curvature at the pole of the surface. For a pure conic surface, the coefficients A, B, C, etc. are zero. For a sphere, k=0, for a hyperboloid, k<−1, for a paraboloid, k=−1, and for an ellipsoid, −1<k<0.

For non-rotationally symmetric profiles, one can describe the phase function required using $$\phi(x,y)=c_1 x+c_2 y+c_3 x^2+c_4 xy+c+c_5 y^2+ \qquad (5)$$

Equations (3) through (5) represent the standard phase inputs of Code V that any arbitrary phase function can be fit to. For instance, one may desire a phase function that has Zernike polynomials added to the phase structure in order to improve the micro-optical element's tolerance to alignment errors. Other phase terms can be added to the relief profile that act to compensate or pre-compensate for other elements in the optical system. In addition to describing the phase of the optical element, one can separately define in a more graphical way alignment or registration marks that are probed interferometrically, mechanically, or through optical imaging in order to align the micro-element.

The manufacturing process provides benefits for telecommunications and optical data storage by enabling the fabrication of optical elements for optical interconnects and for communications.

BRIEF DESCRIPTION OF DRAWINGS

The foregoing and other objects, features and advantages of the invention will become more readily apparent by reference to the following detailed description when considered with the accompanying drawings, wherein.

illustrates a micro optical system for collimating and circularizing a beam from a semiconductor diode laser.

Figure 2A:
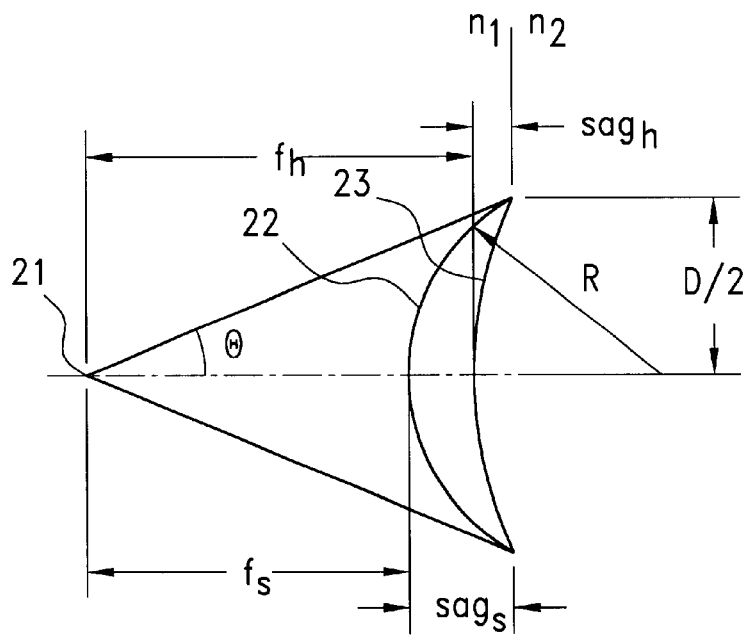
Figure 2B:
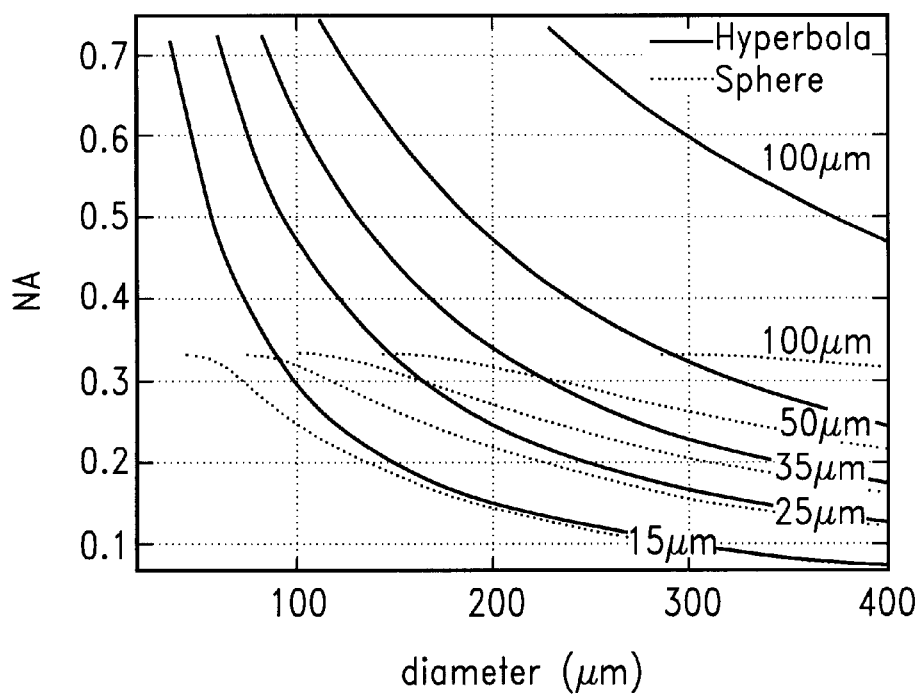

FIG. 2(a) is a schematic diagram illustrating the geometry of microlenses with spherical and hyperbolic surface-relief profiles, and FIG. 2(b) is a graph which illustrates the surface sags required for specific NAs and diameters.

Figure 3A:
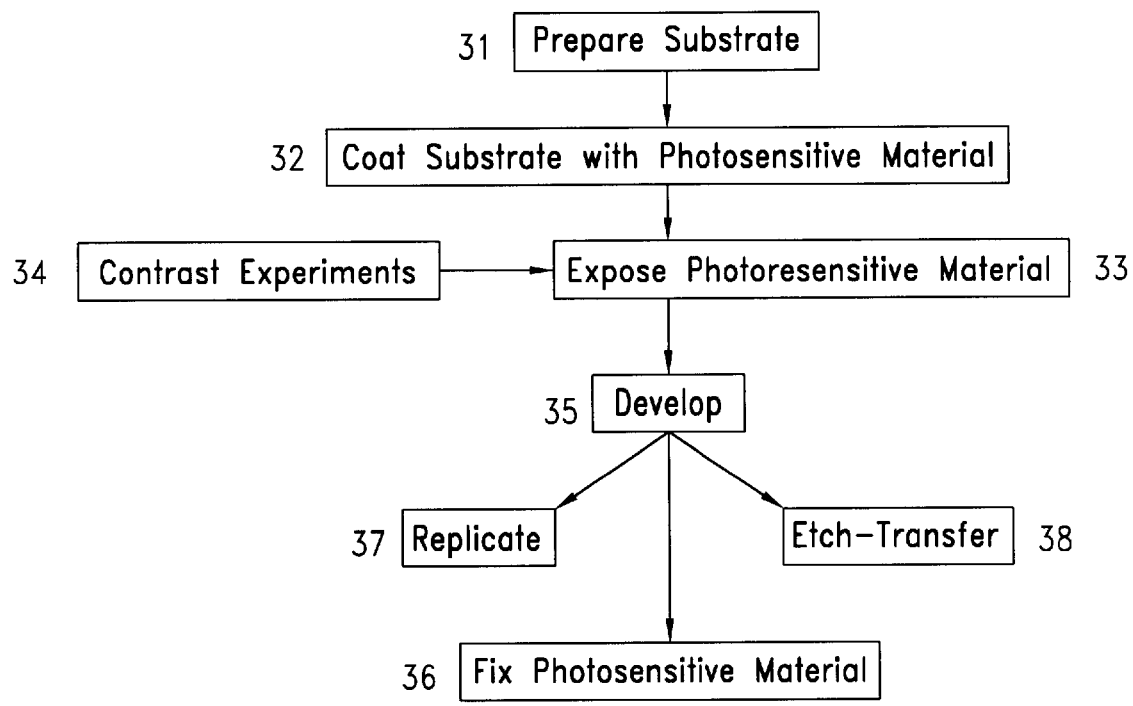
Figure 3B:
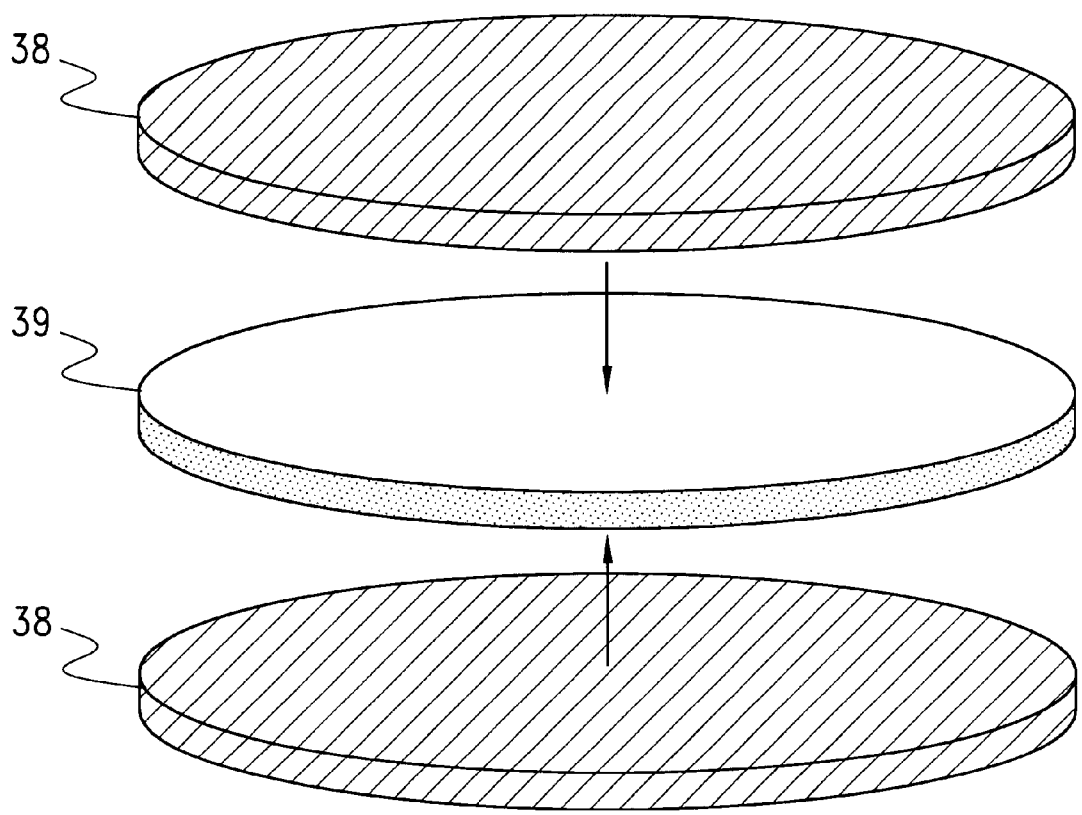

FIGS. 3(a), (b) and (c) are schematic diagrams of the steps involved in fabricating a microstructure using the inventive process hereof, both in photoresist and in masters to make microlenses in mass production, (FIG. 3(a)), FIGS. 3(b) and (c) illustrate the steps which are used in high volume production.

Figure 4:
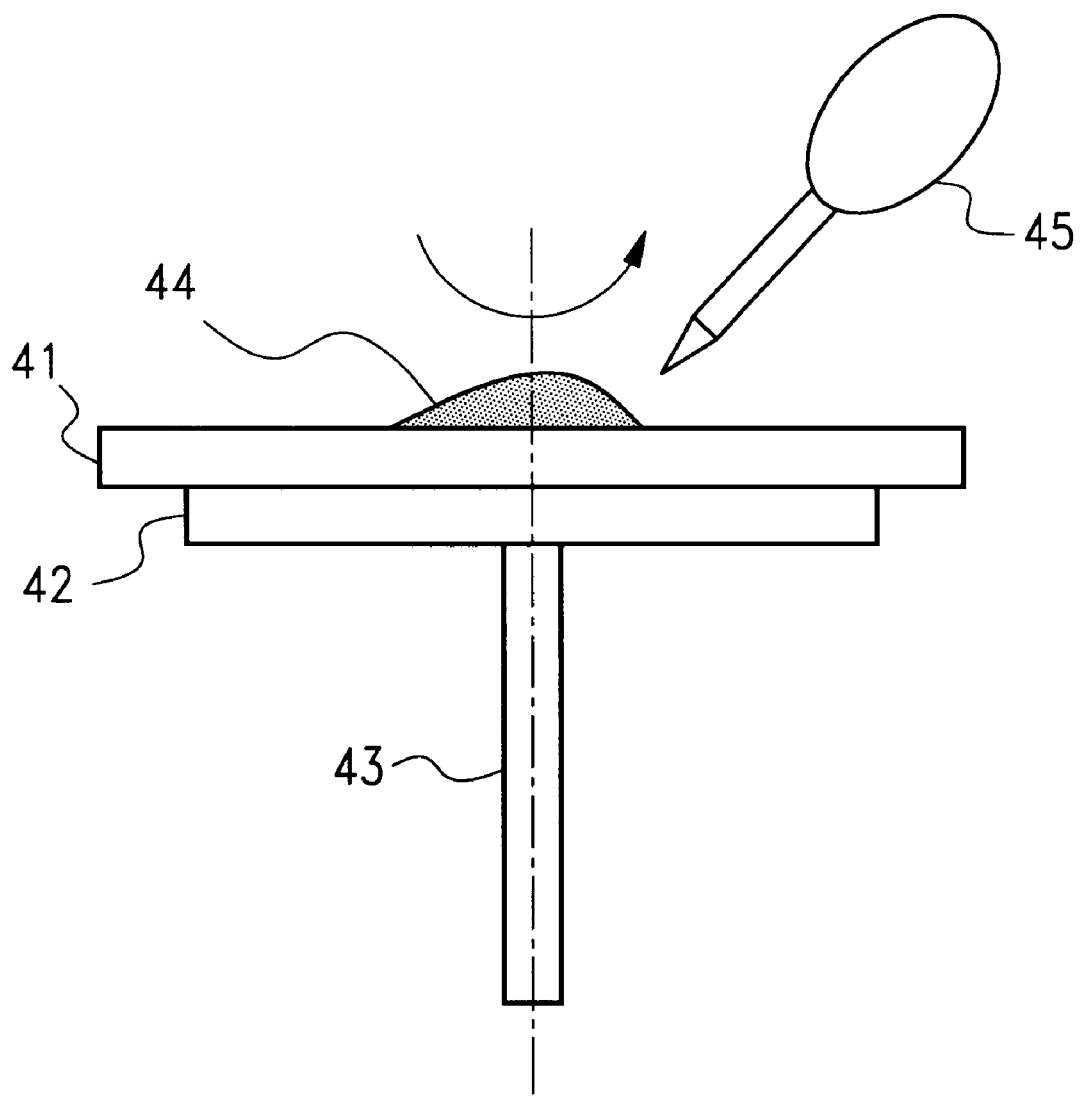

FIG. 4 is a schematic diagram which illustrates the spin-coating method of coating a photosensitive material.

Figure 5A:
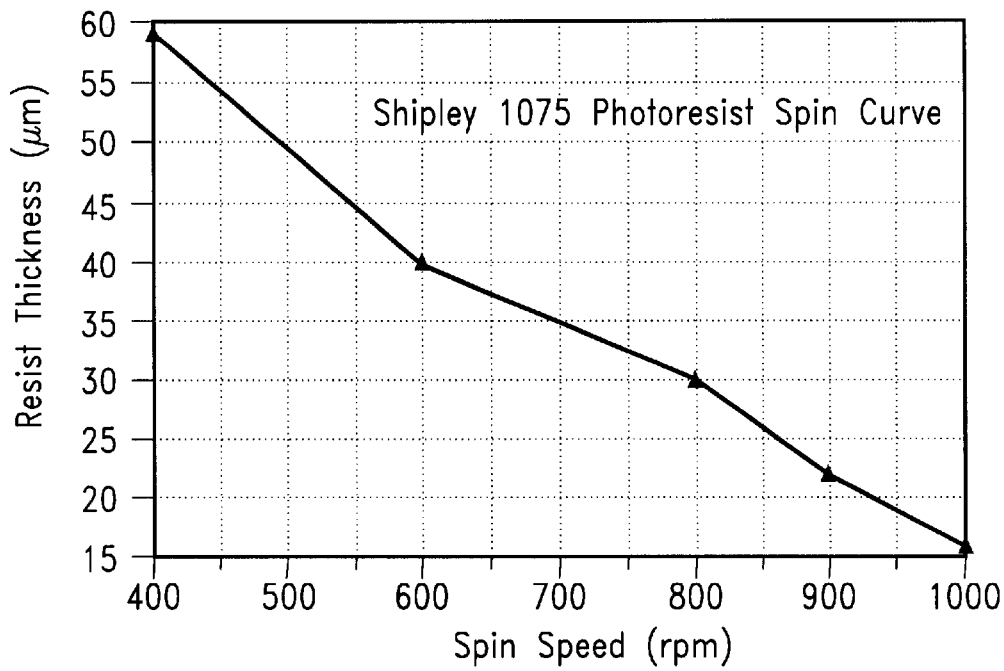

FIGS. 5(a) and (b) depict spin coating curves for Shipley 1075 photoresist and SU8 photoresist respectively. The curves represent the photoresist film thickness as a function of rpm of the spin coater.

FIGS. 6(a) through (e) are diagrams of a several coating steps which may be used in practicing the invention; meniscus coating, dip coating, vacuum coating, electroplating, and spray coating processes being illustrated in FIGS. 6(a) through 6(e), respectively.

Figure 7:
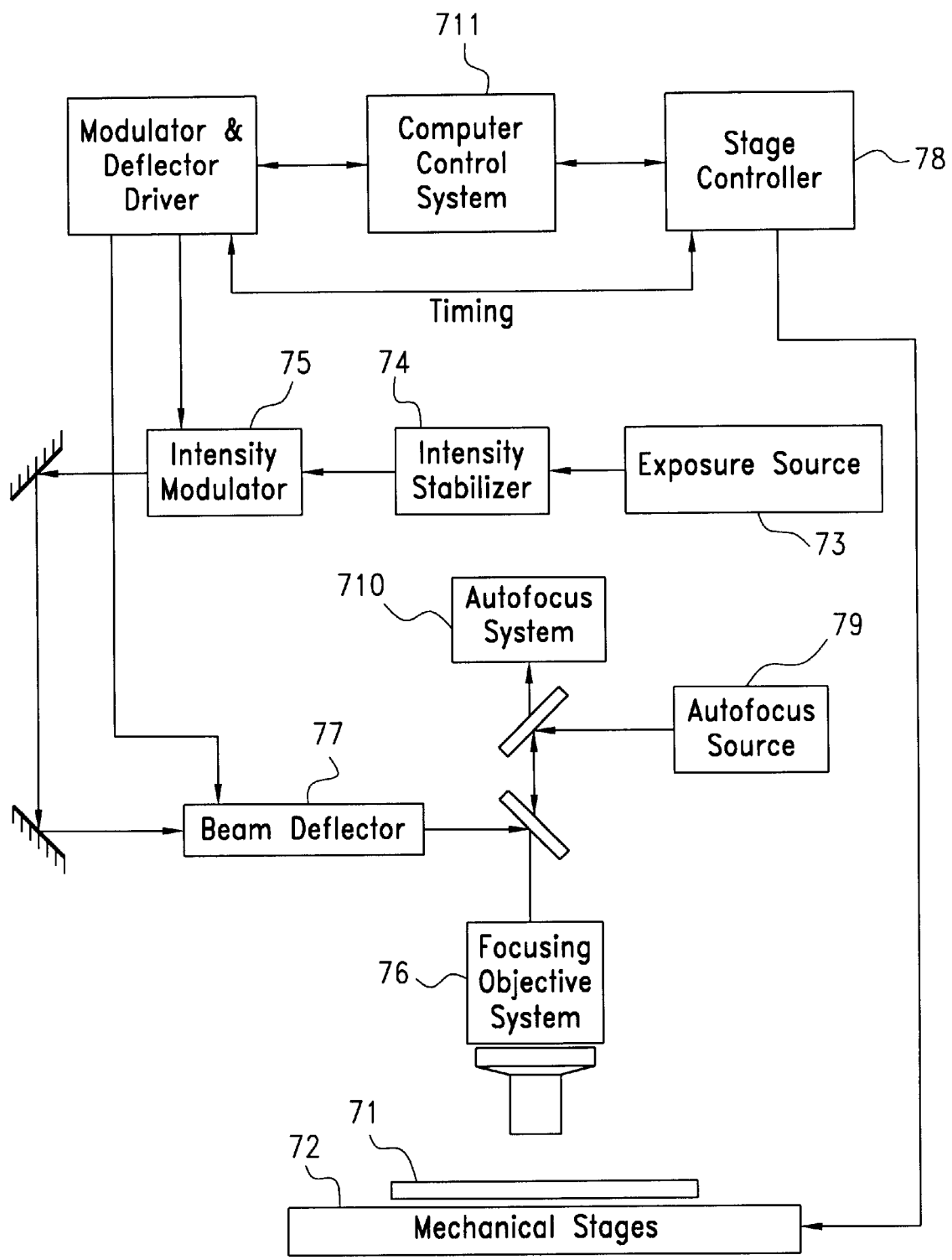

FIG. 7 is a schematic diagram of a laser pattern generator used for the exposure of photosensitive material in accordance with the invention.

Figure 8A:
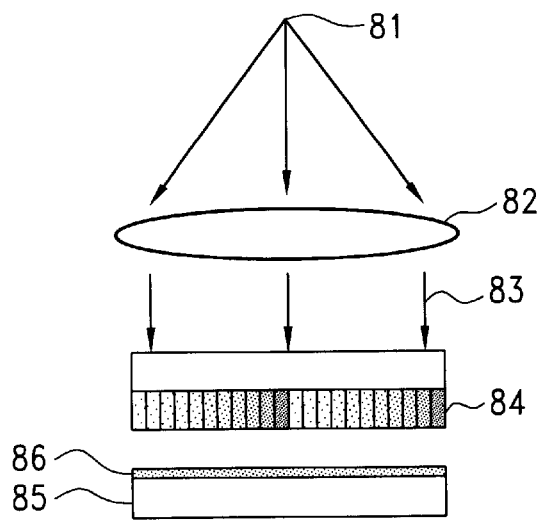
Figure 8B:
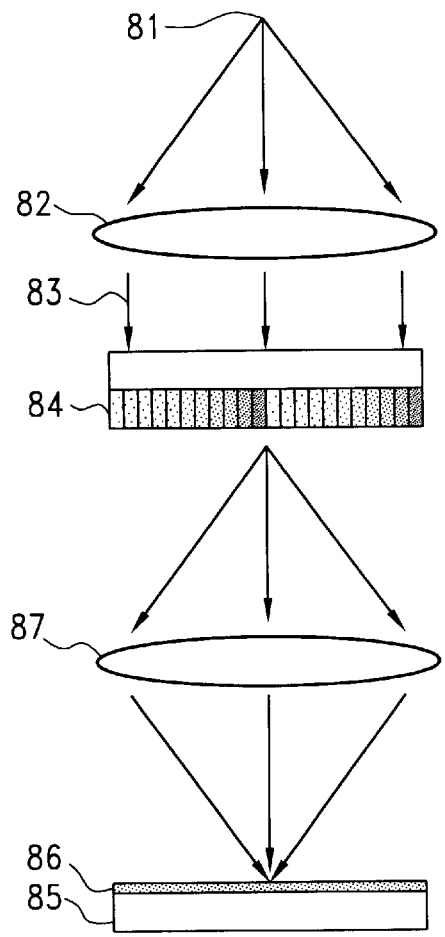

FIGS. 8(a) and (b) are schematic diagrams which depict a mask aligner and a projection exposure system in FIGS. 8(a) and 8(b), respectively. These systems can be used for the exposure of a photosensitive material to a variable dosage of electromagnetic radiation across the substrate.

Figure 9:
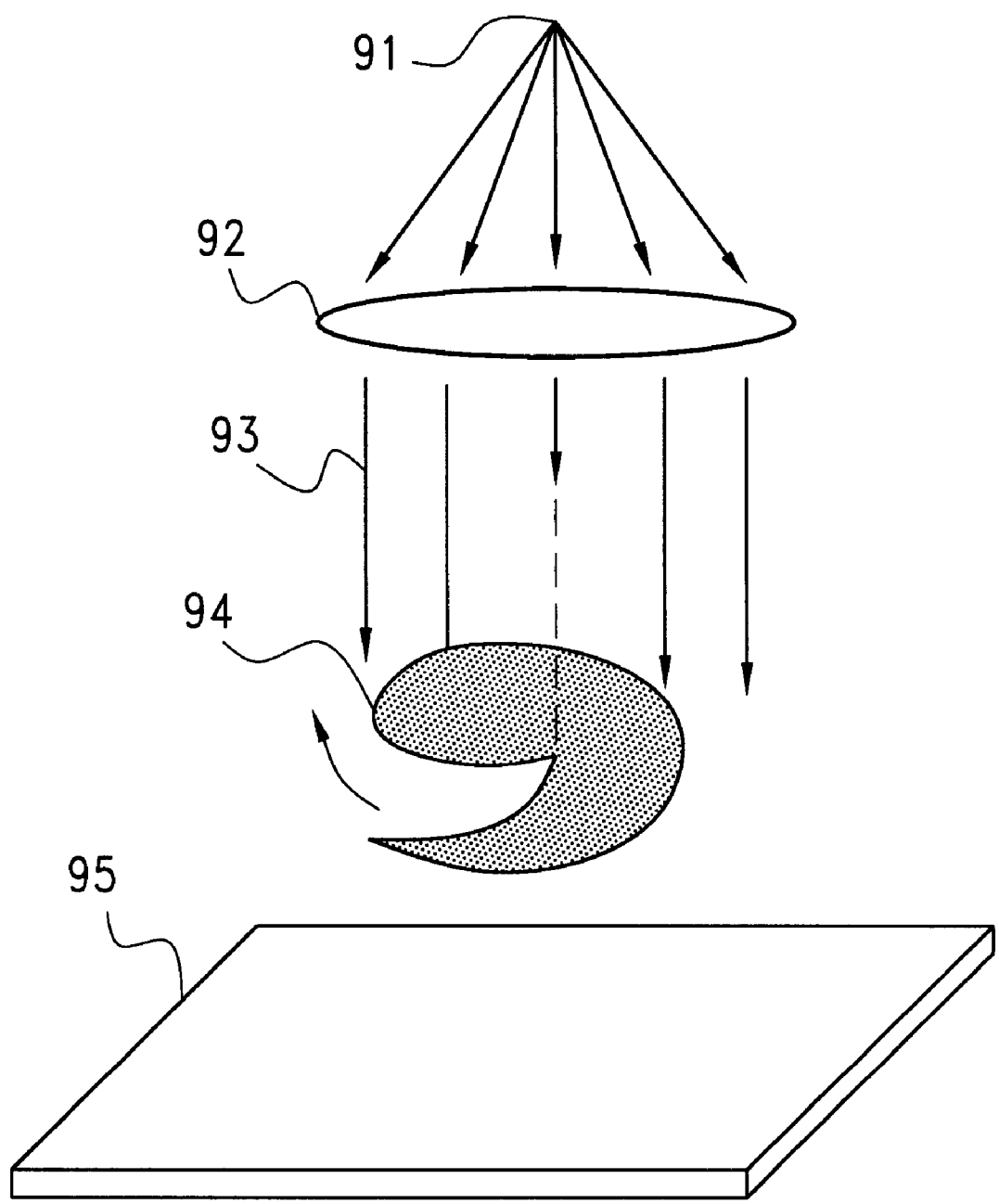

FIG. 9 is schematic diagram which depicts the step of exposing photosensitive materials to with a spatially variable electromagnetic exposure dosage through the use of rotating masks, in accordance with an embodiment of the invention.

Figure 10A:
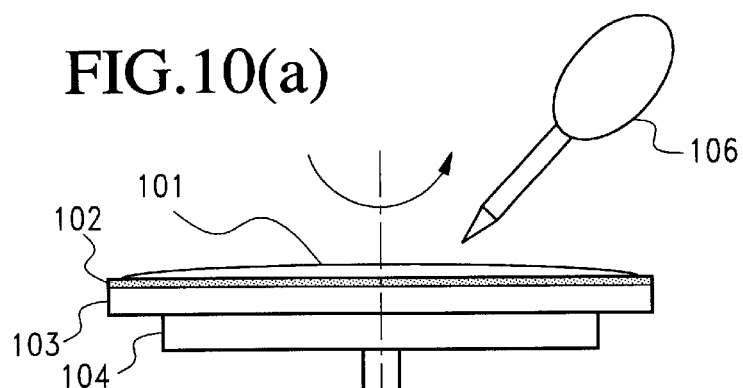
Figure 10B:
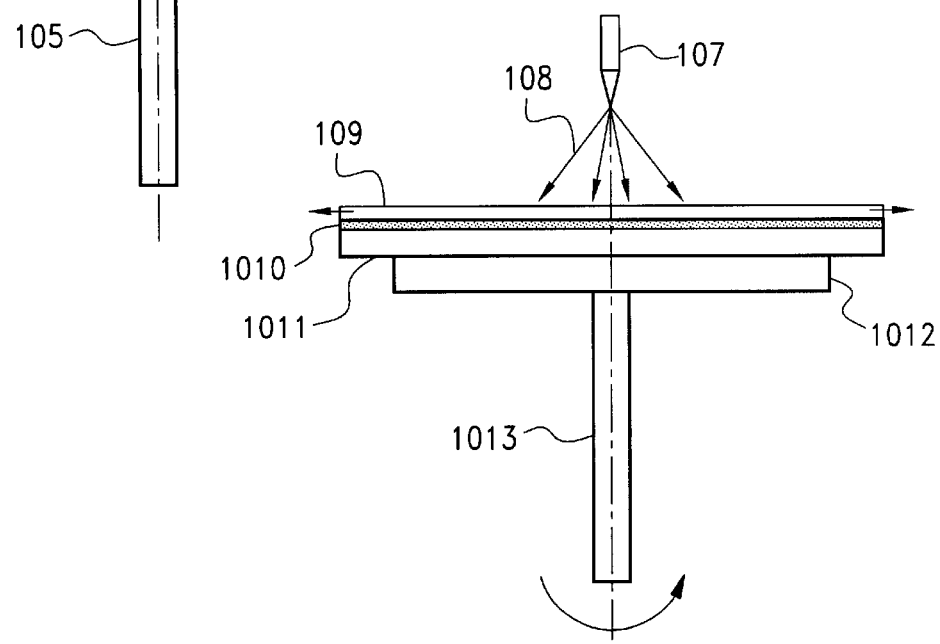
Figure 10C:
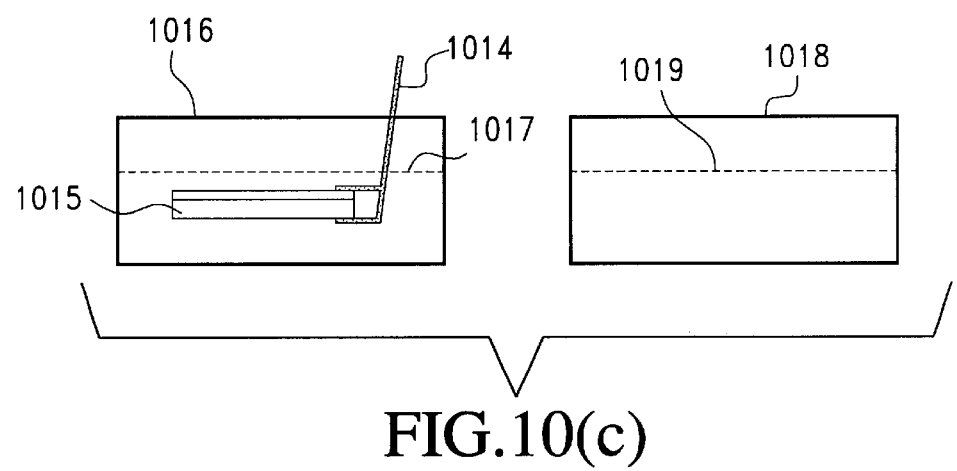

FIGS. 10(a) through (c) illustrate several steps for developing a photosensitive material that include puddle, spray, and dipping, which steps may be used alternatively in accordance with the invention.

Figure 11A:
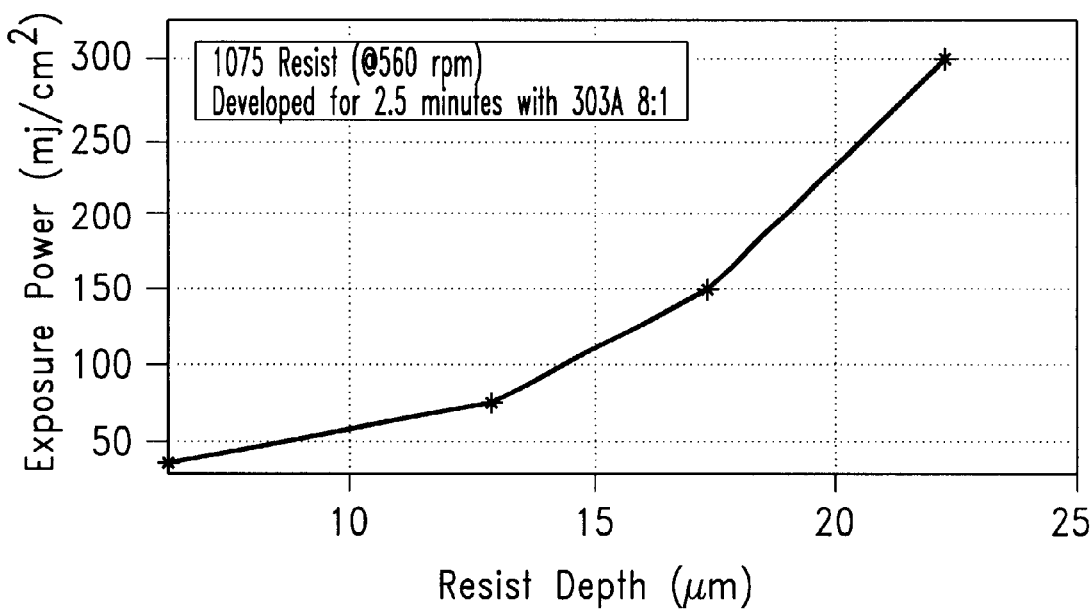

FIGS. 11(a) and (b) illustrate photoresist contrast curves that may be used to achieve arbitrary surface-relief structures, along with several multilevel and continuous-relief profiles that allow one to achieve profiles having heights exceeding 15 $\mu$m.

Figure 12:
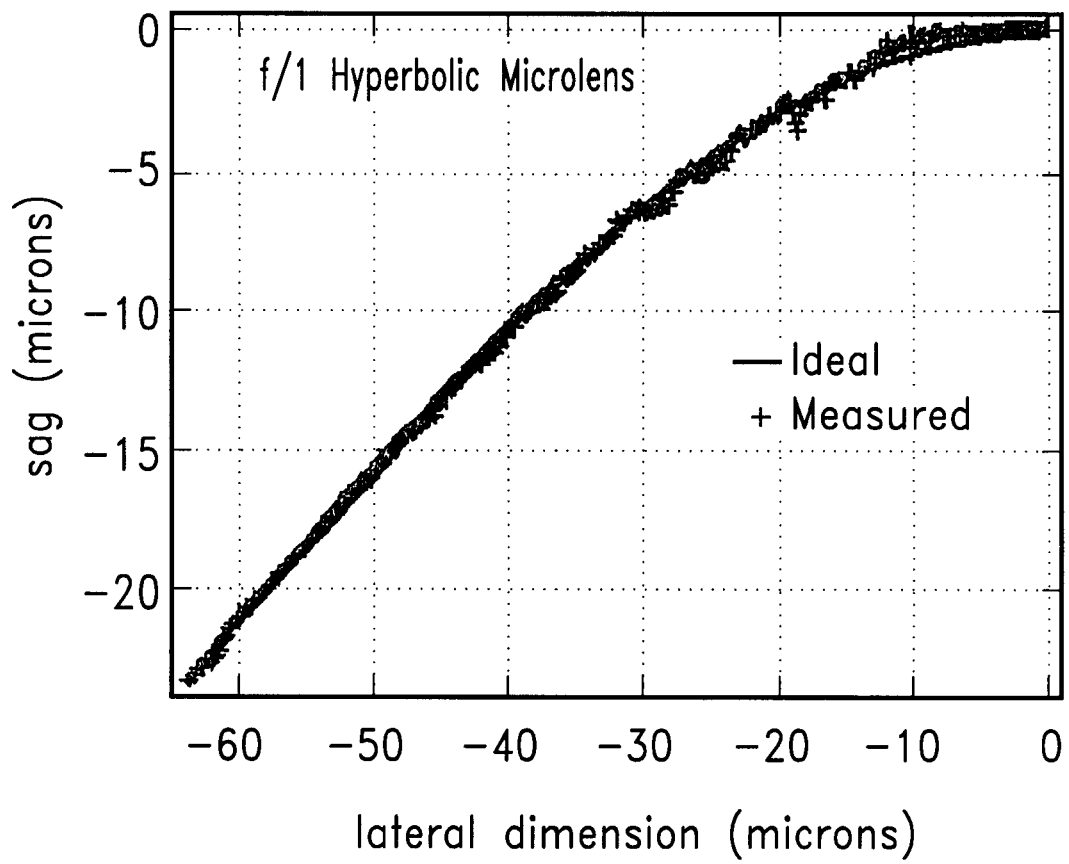

FIG. 12 shows two curves of theoretical and fabricated surface profiles for a f/1 hyperbolic microlens. By comparing these curves, one can fine-tune the predicted response curve of the photosensitive material being exposed and developed.

Figure 13A:
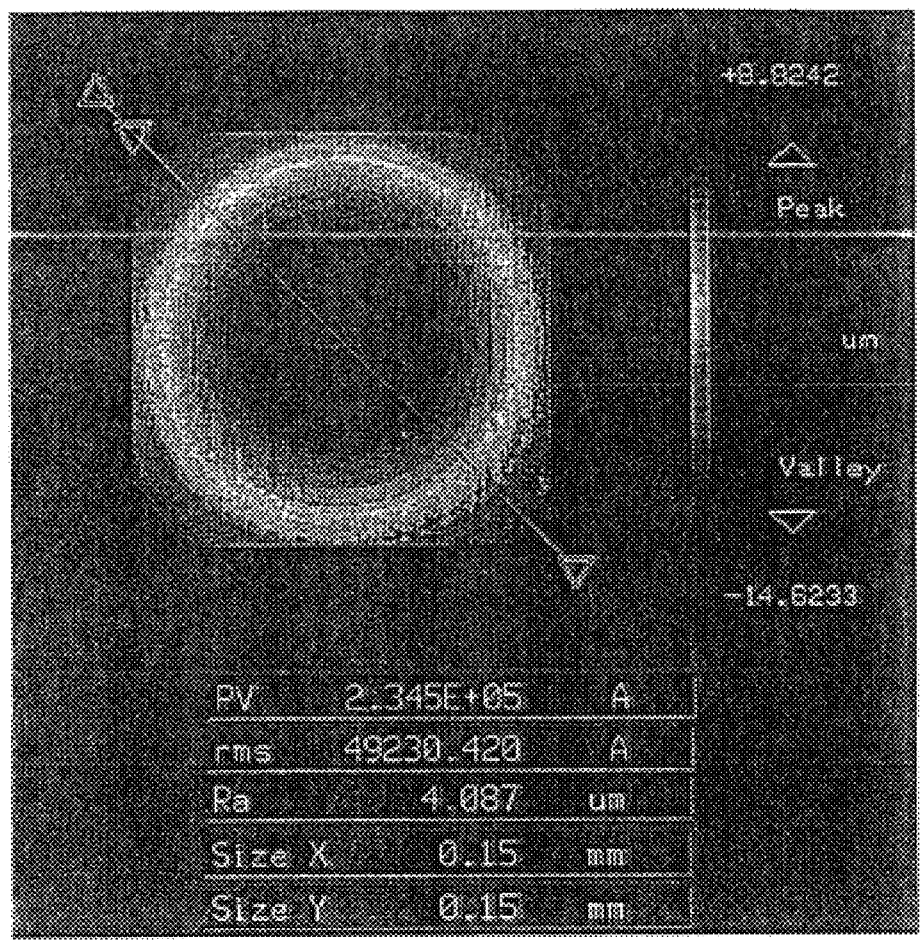
Figure 13B:
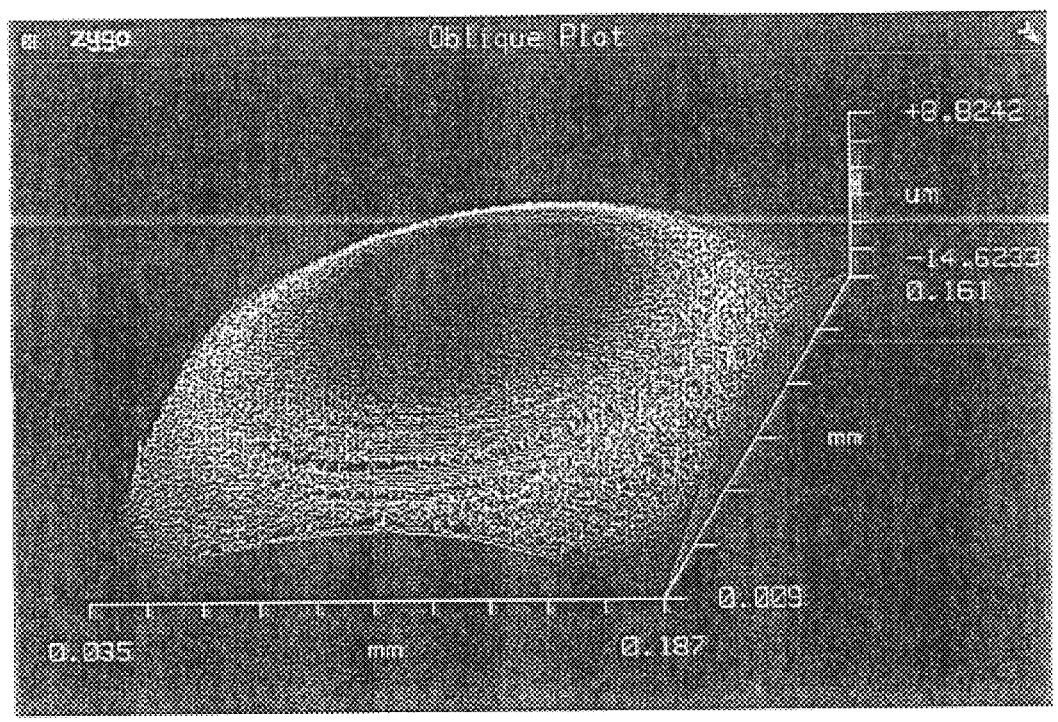
Figure 13C:
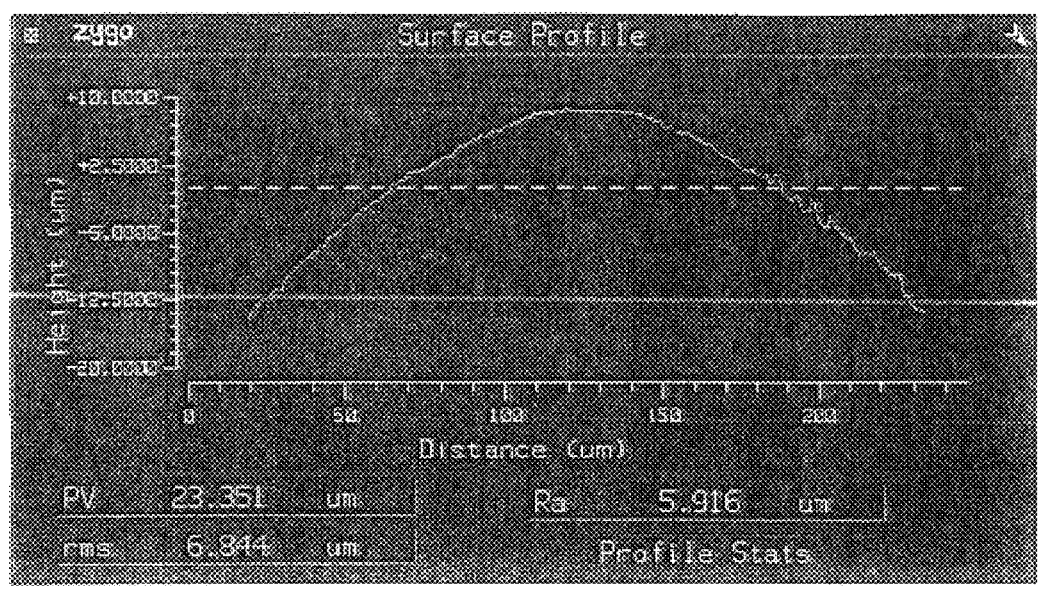

FIGS. 13(a) through (c) are plots of optical profilometry data for a spherical microlens fabricated by patterning photoresist with a x-y laser pattern generator in accordance with the invention.

Figure 14A:
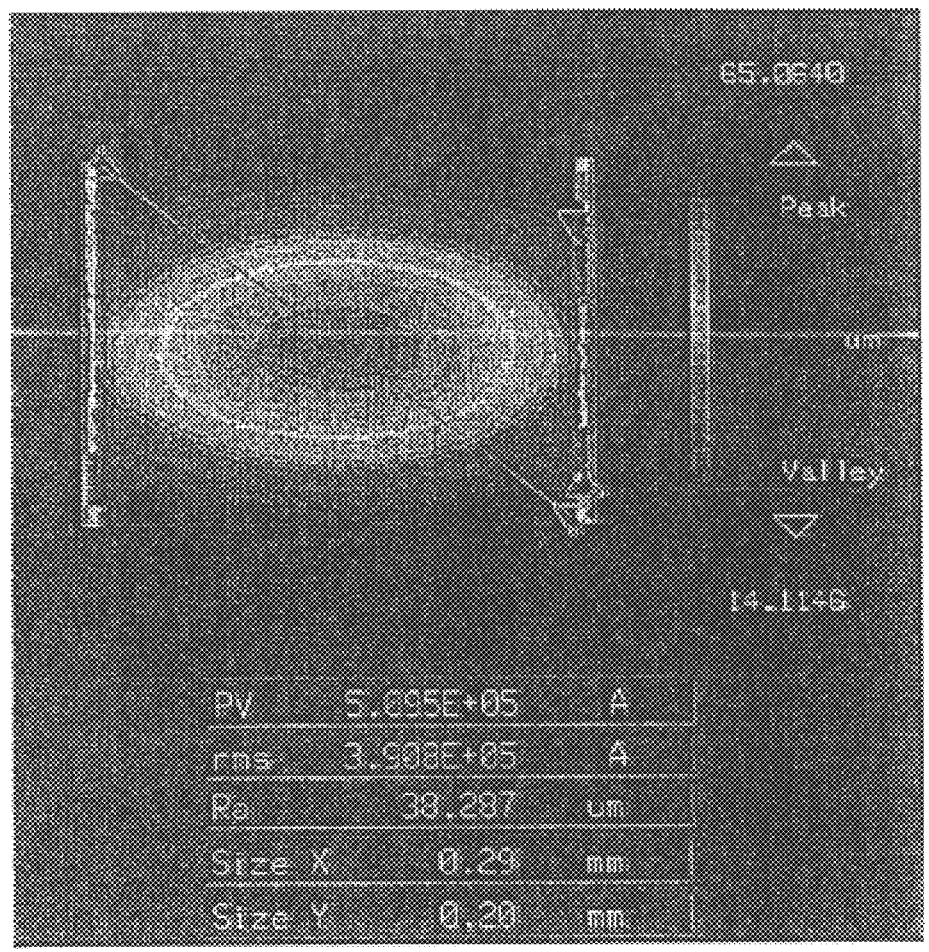

FIGS. 14(a), (b) and (c) are plots similar to those of FIG. 13 of optical profilometry data for a toroidal microlens fabricated by patterning photoresist with a x-y laser pattern generator. Such lenses are advantageous when collimating and/or circularizing anamorphic radiation sources such as a laser diode, as described in the above-referenced related patent application.

FIG. 15 illustrates microstructures with alignment marks that may be provided simultaneously in conjunction with the microstructures made with the inventive process hereof.

DETAILED DESCRIPTION

Figure 1A:
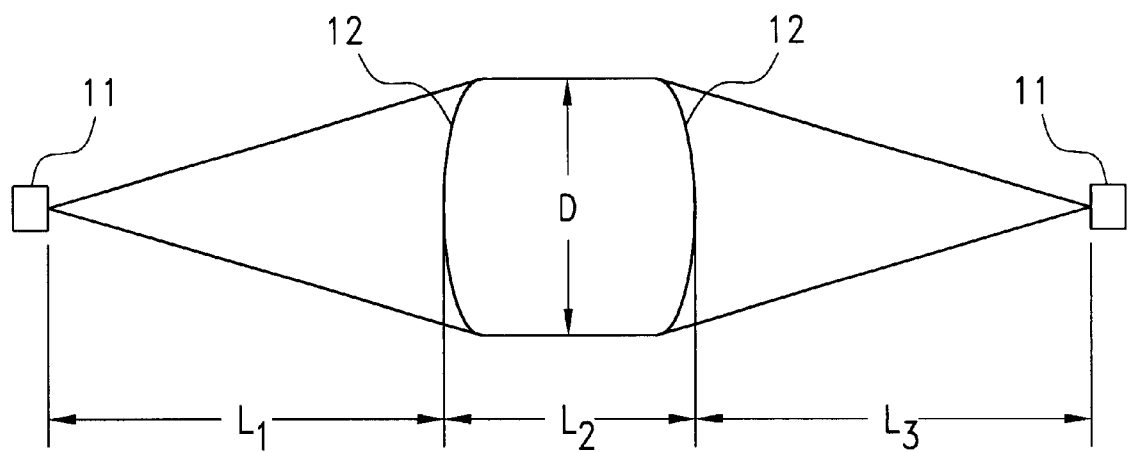
FIGS. 1(a) and (b) are schematic diagrams o systems for optical data storage and optical telecommunications, FIG. 1(a) illustrating a fiber-to-fiber coupler, while FIG. 1(b)
Figure 1B:
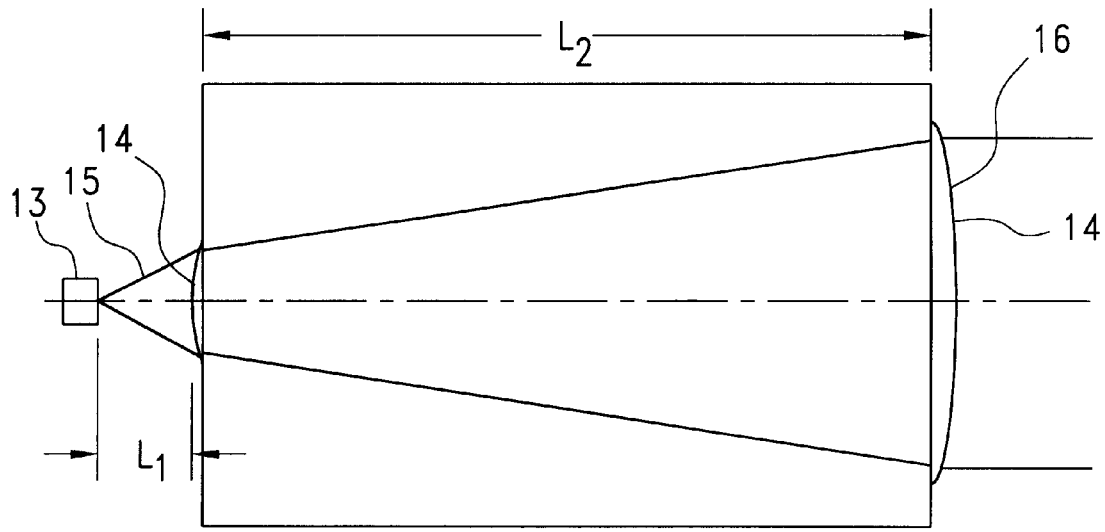

FIG. 1 illustrates some of the profiles needed by the telecommuncations industry. FIG. 1(a) shows an optical design for a fiber-to-fiber coupler, and FIG. 1(b) shows a micro-optical element for collimating and circulating a semiconductor laser diode. In FIG. 1(a) the two fibers (11) are assumed to be identical, both having NA=0.25. The collimating and focusing microlenses (12) are identical and are rotationally symmetric, aspheric surfaces. For a diameter D of 140 $\mu$m, the surface sag of the microlenses is 20 $\mu$m. The separation distances $L_1$, $L_2$, and $L_3$ are 250 $\mu$m, and 100 $\mu$m, and 250 $\mu$m, respectively. Such a design can achieve greater than 95% coupling efficiency. In FIG. 1(b) the semiconductor laser (13) emits an astigmatic beam (15) that has a full-width at $1/e^2$ of 8° and 21°. The astigmatism between the fast and slow axis is 4 $\mu$m. Using the invention described by this patent, one can fabricate a two-element system, wherein each element is a toroidal surface. The first microlens (14) has a clear aperture of 120 $\mu$m and a maximum sag of 16 $\mu$m. The second microlens (16) has a clear aperture of 600 $\mu$m and a sag of 35 $\mu$m. The dimensions $L_1$ and $L_2$ for FIG. 1(b) correspond to 130 $\mu$m and 4 mm, respectively. Note that since one can fabricate anamorphic microlenses of sags greater than 15 $\mu$m using this invention, one can produce the design illustrated schematically in FIG. 1(b) and achieve looser alignment tolerances than current commercially available micro-optical elements. For example, circularizers sold by Blue Sky Research (Santa Cruz, Calif.) have only ±0.5 $\mu$m lateral tolerance in the fast axis of the laser, versus ±3 $\mu$m of the presented design.

FIG. 2 illustrates the geometry of microlenses with spherical and hyperbolic surface-relief profiles and illustrate the surface sags required for specific NAs and diameters. Illustrated in FIG. 2(a) is a schematic of how a point source (21) can be collimated by a microlens with a spherical (22) or a hyperbolic (23) relief profile. The sag of the spherical microlens is given by $$sag_h = \frac{f_h n_1}{(n_2 + n_1)} \left[ \sqrt{1 + \frac{D^2}{4f_h^2} \frac{n_2 - n_1}{n_2 + n_1}} - 1 \right], \quad (6)$$

where D is the diameter of the microlens and R is the radius of curvature of the spherical surface and is related to the front focal length according to $$R = f_s(n_2 - n_1) \quad (7)$$

where $n_1$ and $n_2$ are the indices of refraction of the incident and transmitted media, respectively. For the hyperbolic surface, the surface sag is given by $$sag_s = R - \sqrt{R^2 - (D/2)^2}, \quad (8)$$

where $f_h$ is front local length of the hyperbolic microlens. Note that for a given NA defined by $n_1 \sin \theta$, the sag of the hyperbola will be less than that of the spherical lens. The hyperbolic surface is advantageous since it is the optimal refractive surface for collimating (or focusing) a point source when $n_2 > n_1$.

FIG. 2(b) illustrates the relationship between diameter and NA for microlenses with spherical and hyperbolic surface-relief profiles for elements that have a maximum sag of 15, 25, 35, 50, and 100 $\mu$m of sag. In calculating the curves for FIG. 2(b), indices of refraction of $n_1=1$ and $n_2=1.5$ were chosen. One notes that a spherical refractive surface is only able to attain a numerical aperture of 0.32. One also notes that the numerical aperture of a system (e.g., optical fiber or laser diode source) does not have to be very large before the surface sag required exceeds 15 μm. For example, a microlens that is only 300 μm in diameter requires a surface sag of 15 μm in order to operate at NA=0.1, and a surface sag of 25 μm in order to obtain NA=0.25. Although FIG. 2(b) only illustrates examples for hyperbolic and spherical surfaces, it should be reiterated that the current invention is by no means limited to these profile shapes. The patterning of surface-relief structures with elliptical, cylindrical, and arbitrary profiles involving the use of Zernike polynomials, are but a few of the surfaces that can be achieved. The invention described by this patent allows one to fabricate such deep-sag, arbitrary profile microlenses, such that one can build and assemble micro-optical systems with the minimum amount of wavefront error.

Figure 3C:
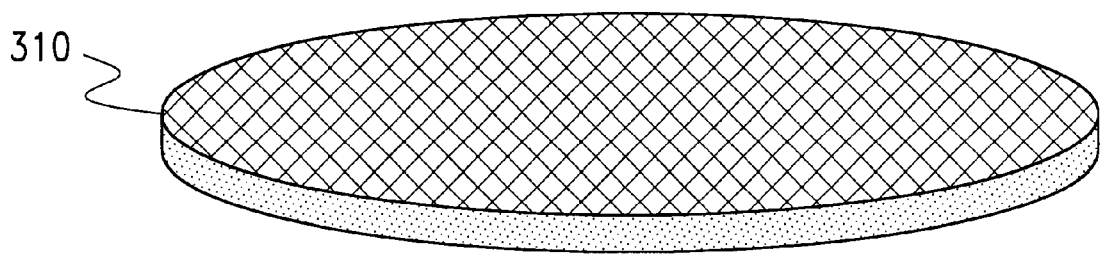

Steps for the exposure of a photosensitive material are illustrated in FIG. 3. One first prepares a given substrate by (Step 31) cleaning the surface to promote adhesion of the photosensitive material, as well as to reduce the probability of defects caused by surface contamination. The cleaning process is dependent upon the substrate in question and can involve the use of solvents, acid solutions, ozone, etc. The cleaner the environment, the less contamination the substrate will contain that may interfere with the proper production of the desired microstructures. After the cleaning process, a dehydration bake is typically performed on a hotplate or in an oven to remove any residual volatiles or water on the surface. Once the substrate surface is prepared in Step 31, the photosensitive material in the form of a film is coated on the surface (Step 32). This can involve a variety of coating techniques that will discussed in more detail later. The exposure of the surface (Step 33) is performed based upon the contrast of the photosensitive material. In other words, experimentally in step 34, one determines the exposure dosage required to achieve a specific response from the photosensitive material as a function of the coating parameters, the specific method of exposure, and the developing parameters. Once exposed, the photosensitive material is developed in step 35, typically in an aqueous solution and the desired surface-relief pattern is obtained. For certain applications, the photosensitive material may be suitable as the final medium for the delivered microstructured surface. In these cases, the photosensitive material may require additional fixing (Step 36) in order to make the material physically more durable, as well as to make the material resistant to solvents. This may involve further oven bakes, UV exposures, or other treatments. For other applications (especially for high volume production) the final medium is a polymer. The microstructured photosensitive material, can then be replicated (Step 37) via a cast-and-cure process, compression molding, injection molding, or compression injection molding. This typically involves first transferring the relief-pattern of the original photosensitive material into a more durable medium. To transfer the pattern into metal, an electroforming process can be conducted. One can also etch-transfer (Step 38) the photosensitive material into the underlying substrate using a dry etching process such as reactive ion etching (RIE), ion milling, chemically assisted ion beam etching (CAIBE), or reactive ion beam etching (RIBE). The etched substrate can be used to create replicas as an embossing tool, or can be used as the final product itself. In this manner, although the photosensitive surface may not meet the operational requirements of a specific optical system (temperature range, optical throughput, laser damage threshold, etc.), the etch-patterned substrate (substrate materials may be GeSi, $SiO_2$, ZnS, ZnSe, etc.) can. The process may continue by forming masters, and using alignment marks, sandwiching the duplicates together to form microlenses, as shown in FIG. 3(b).

The manufacturing process is conducive to volume manufacturing. For telecommunications and optical data storage systems, volumes of micro-optical elements can be in the millions, so it is imperative that one can produce the desired optical elements in a cost-effective manner. The manufacturing method described by this patent relates to a method for fabricating high-precision, arbitrary surface-relief patterned masters, from which high-volume replicas can be created. FIG. 3(b) illustrates a set of replication tools 38 that can be used to replicate a wafer 39. The wafer can have a polymer coating that is embossed by the replication tools, or through a cast-and-cure method, one can achieve the desired surface-relief profiles. Once both sides of a wafer are replicated to achieve the desired micro-optical system (such as those represented by FIGS. 1(a) and 2(b), for example) one can dice the wafer 310 into subapertures, thereby achieving hundreds of micro-optical systems for each wafer processed. For applications that require non-polymer materials, one may pattern wafers with a multitude of optical elements, etch the entire wafer simultaneously, and then dice the wafer into components. Other variations of this wafer processing technique for high-volume applications are obvious to those skilled in the arts.

FIG. 4 illustrates how photosensitive materials can be spin-coated onto a given substrate. For illustrative purposes, we will discuss photoresists, wherein the photosensitive material is suspended in a solvent solution. Commercial spin coating machines can be obtained by such vendors as Headway Research, Inc. (Garland, Tex.) and Karl Suss America, Inc. (Waterbury Center, Vt.), and provide the best method for achieving uniform coatings (<λ/10 @ HeNe) across flat substrates. A schematic of a spin-coater is illustrated in FIG. 4. A substrate 41 is placed onto a chuck 42 that is mounted to a motor spindle 43. The substrate is held in place by vacuum, mechanically, or by both methods. The spin-coating process itself involves a dispense stage, a spreader stage, and final spin stage. In the dispense stage, photoresist 44 is applied using a spray, a pipette 45, or by any other means of placing a puddle of the photosensitive material onto the substrate surface. This coating process is performed either statically (the substrate being stationary) or dynamically (the substrate rotating at a slow rpm). Once dispensed, the photoresist is spun at either the final desired rpm, or is first spun for a short amount of time (approximately 5–10 seconds) at a lower rpm, and spreads out over substrate 41 in what is termed a spreading stage. This spreading stage is particularly useful for thicker photoresists to ensure that the resist is first spread across the substrate uniformly before the spinner is moved to the final rpm stage. In moving to the final rpm stage, the time of acceleration is another parameter that can be varied to make a more reliable process. To ensure proper spin uniformity, one wants to make sure that the atmosphere of the spinner bowl is saturated with vapor. In this manner inhibited drying is achieved, to help ensure that during the coating process, no portion of the photoresist partially dries before the final spin stage. The final thickness of the photoresist is determined by concentration and the viscosity of the photoresist and the rpm of the final spin stage.

Figure 5B:
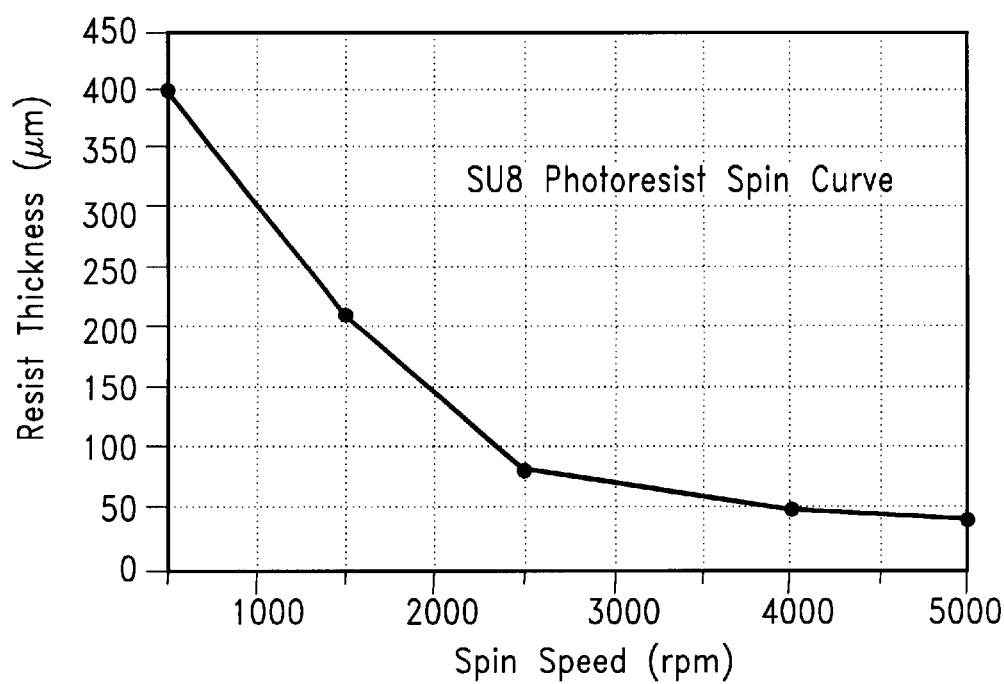

Illustrated in FIG. 5 are spin curves for suitable photoresists as are commercially available (a) Shipley 1075 photoresist, Shipley Co. Inc. of Marlborough, Mass., as well as for (b) SU8, available from Lighography Chemical Corp. of Watertown, Mass. The curves illustrate the film thickness achieved as a function of spinner rpm. For spin-coating, the film thicknesses t achieved generally follow a curve given by $$t = \frac{KC^\beta V^\gamma}{\omega^\alpha},\qquad(9)$$

where ω is the spin speed, C is the material concentration in the solvent, V is the viscosity, and α, β, and γ are constants. Consequently, given a particular photosensitive material solution of a certain concentration and viscosity, one can calculate the film thickness as a function of spin speed (rpm).

After the photoresist is spin-coated, the substrate is baked (typically called a soft bake or a prebake) in order to remove residual solvents and to anneal any stress in the photoresist film. This step controls the sensitivity of the photoresist. A longer and hotter softbake will tend to reduce the sensitivity of the film, but a too short or a too cool of a baking temperature will leave residual solvents in the resist film, that will affect the profiles of the final microstructures. Typically softbake temperatures are in the 90° to 110° C. range and the bake times are a few minutes for a hot plate, to 30 minutes to several hours for a convection oven. To ensure that the photoresist layer does not develop a slight wedge during the baking process, one should make the horizontal surfaces of the convection oven or hot plate level. When processing thick photoresist (>15 μm), if prior to the softbake step, the photoresist-coated substrates are preferably allowed to set out for what is termed a relaxation stage. This waiting period is typically on the order of 30 minutes, and helps reduce stresses in the thick photoresist film. For thick photoresist, hot plate soft bakes are preferential since the photoresist heating is occurring from the bottom of the film to the top. In this manner solvents are not trapped by the skinning of the photoresist top that can occur with oven bakes. For thick photoresist, one also wants to use a hot plate with a ramping feature so that the resist is slowly ramped up to its soft baking temperature, thereby reducing the chance of solvent bubbles to form in the photoresist.

An example of a photoresist coating recipe suitable used is:
1. Clean substrate
2. Dispense Shipley 1075 photoresist onto a clean substrate using a large pipette.
3. Spread stage: 200 rpm for 30 seconds
4. Final stage: 500 rpm for 3 minutes
5. Relaxation stage: Let substrate sit for 30 minutes.
6. Softbake: Hot plate at 90° C. for 10 minutes.

From FIG. 5, one notes that the above recipe will result in a photoresist film thickness that is 50 μm in thickness.

FIG. 6 illustrates other techniques for depositing photoresist, which may be preferable for coating non-plano substrates. These coating methods include meniscus coating, dip coating, vacuum coating, electroplating, and spray coating. In meniscus coating, see FIG. 6(a), the substrate 61 is mounted horizontally below a roller 62. Photoresist 63 is deposited on the roller, creating a meniscus above the substrate. By translating the roller, and hence the meniscus above the substrate, one can coat the substrate with a layer of photoresist 64 which is uniform to typically 5–10%.

Figure 6A:
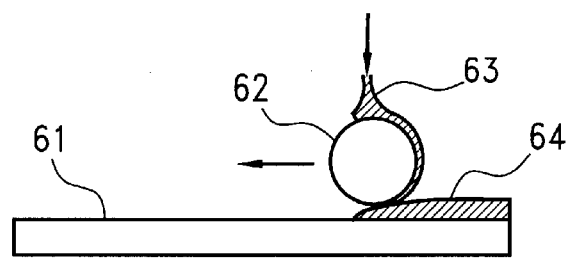
Figure 6B:
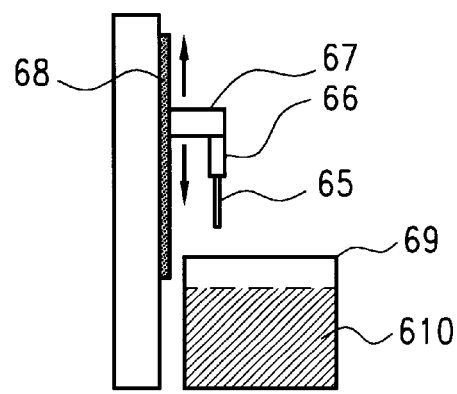

In dip coating, see FIG. 6(b), the substrate 65 is held in place by a clamp 66. This clamp is mounted to a cantilever arm 67 which translates up and down along a rail 68. In this manner, the substrate assembly can be dipped into a container 69 that holds photoresist 610. Controlled pulling of the substrate out of the solution is required in order to achieve a uniform, non-striated, film coating. Once pulled out of the solution, the film is baked. In order to achieve thick films, higher viscosity material can be used, but more typically the substrate, once dipped, and coating is at least partially dried, is then dipped again. This process is repeated until the desired film thickness is achieved. Manufacturers of dip coaters include Chemat Technology, Inc. of Nothridge, Calif. The dip method may be used for coating plano and non-plano surfaces with photoresist films greater than 15 μm in thickness.

Figure 6C:
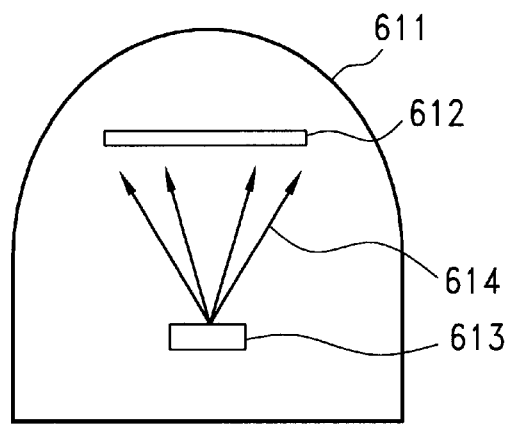

FIG. 6(c) illustrates vacuum depositing of a photosensitive film. In vacuum deposition, the substrate 612 is placed into a vacuum chamber 611 that contains a source 613 of the material to coat. The source can be heated electrically or an ion or electron gun can be used to sputter the material 614 onto the substrate.

Figure 6D:
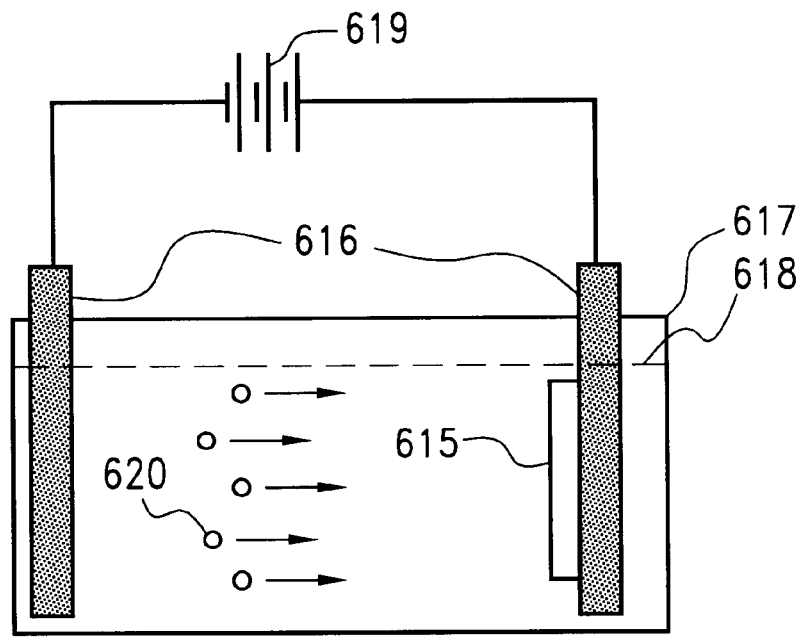

FIG. 6(d) illustrates an electroplating technique which involves taking a conductive substrate 615, and mounting it to an electrode 616. The electrode is placed in a container 616 that holds an electroplating solution. The substrate is mounted such that it is below the fluid level 618 of the solution. A potential difference is created between the two electrodes using a power supply 619. Due to this potential difference between the bath and substrate, the photoresist solution 620 plates onto the substrate. Resist thickness achieved depends upon numerous plating parameters such as applied voltage, bath temperature, and electroplating time. Photoresist conducive to electroplating is sold by Shipley as PEPR 2400 positive tone and Eagle 2100 ED negative tone. The electroplating process is particularly useful for coating non-plano substrates. The electroplating method may be used to coat photoresist with thickness over 15 μm.

Figure 6E:
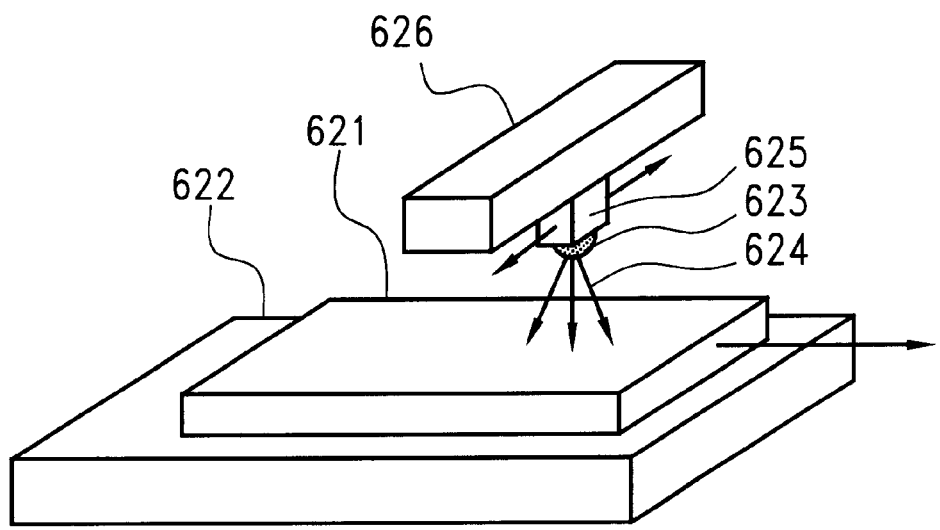

Photoresist can also be coated using a spray method as shown in FIG. 6(e). Machines for spray-coating photoresist can be obtained from such vendors as Specialty Coating Systems (SCS) of Indianapolis, Ind. A substrate 621 is placed on a mechanical stage, conveyor belt, or roller 622. Above the substrate is a spray nozzle 623 that is mounted to an arm 625 that travels laterally along a rail 626. The photoresist 624 is sprayed onto the substrate as the spray nozzle translates in a motion perpendicular to the substrate translation axis. Additional axes of motion may be added to the spray arm 625 in order to allow for the coating of non-flat substrates. The spray thicknesses depend upon multiple parameters such as spray velocity, nozzle shape, distance of spray nozzle to substrate, and velocity of the mechanics. In order to create films of thickness greater than 15 μm, one cannot necessarily use photoresist of a higher viscosity due to the tendency for the spray nozzle to become clogged. Rather, one can spray multiple coatings with a suitable bake step in between, or one can reduce the velocities of the mechanics in order to coat thicker layers in one step. The spray-coating method may be used for achieving resist films greater than 15 μm, however this method is not preferred because the uniformity may not be as good for plano substrates as in the spin-coating method. Spray coating, however, does have advantages for non-plano substrates.

Once coated, the photoresist is ready to be exposed to a varying dose of energy. As mentioned earlier, this can be achieved using a laser pattern generator, grayscale photolithography, translating apertures during exposure or holographically.

FIG. 7 illustrates schematically a laser pattern generator. This device will pattern a photosensitive substrate 71 mounted on mechanical stages 72 with a given exposure dosage as a function of the surface's spatial coordinates. Typically the exposure source 73 for such an instrument is a laser. For photoresist that is sensitive in the blue or UV portions of the electromagnetic spectrum, the radiation source used is typically an argon-ion, krypton-ion, or helium-cadium laser. With advances in semiconductor laser diodes, these gas lasers will most likely be replaced in the design of LPGs. The exposure source is intensity stabilized using a noise-eater 74 and is then modulated using an acoustopic modulator or an electro-optic modulator 75. Note that although a single beam is being illustrated passing through their own intensity modulator. The multi-beam geometry is advantageous for increasing the writing speed of the LPG. Once modulated, the exposure beam or beams can be passed directly into a focusing objective 76, or they can first pass through a beam deflector 77, such as a set of mechanical galvos or AO deflector. The beam deflector 77, along with the intensity modulator 75 are computer-controlled 711 and timed with the stage controller 78 to ensure that the appropriate exposure dosage mapping on the photosensitive substrate is achieved. The focusing of the exposure source onto the substrate is monitored through the use of an autofocus source 79 and detector 710. In the case of photoresist that is not sensitive to radiation above 500 nm in wavelength, one can use a red or near-IR semiconductor laser as the autofocus radiation source. This autofocus system allows one to ensure that the exposure spot is accurately focused onto the substrate surface. This is particularly critical for high-NA system, wherein the depth of focus is sub-micron.

FIG. 8 illustrates two different geometries for grayscale mask lithography: (a) contact or proximity lithography and (b) projection lithography. In either geometry, an exposure source 81 is collimated using a condenser optical system 82 that can consist of any combination of lenses and reflective mirrors. The illumination radiation 83 is then incident upon a reticle or a photomask 84 that has a transmission that varies as a function of location across the mask clear aperture. The radiation transmitted (or reflected) by the grayscale reticle is thereby intensity modulated. In the case of contact or proximity printing, see FIG. 8(*a*), the transmitted radiation propagates in free space and exposes a substrate 85 coated with a photoresensitive material 86. The photomask can either be put directly in contact with the substrate (contact-printing), or a small gap (typically on the order of a micron) is made between the mask and the coated substrate in order to reduce the probability of contamination (proximity printing). In the case of projection lithography an imaging optical system 87 that consists of one or more refractive or reflective optical elements is used to protect the transmitted (or reflected) image of the grayscale reticle 84 onto a photosensitive substrate 85, 86.

FIG. 9 illustrates exposing a photosensitive material 95 with a rotating mask 94. First an exposure source 91 is collimated by a lens or lens system 92. The collimated radiation 93 is incident upon a mask 94. In FIG. 9 we have illustrated a mask that consists of only opaque or clear areas in the form of a spiral. In general, one can have a grayscale mask. By rotating the mask such that the rotation time is short compared to the total exposure time. One can use a binary mask (either opaque or clear) to create a grayscale exposure of a photosensitive material. Note also that, one can construct a mask which is not merely rotated, but could also be translated for the exposure required to create a cylindrical lens.

FIG. 10 illustrates several different methods for developing photoresist that include (a) puddle developing, (b) spray developing, and (c) dip or immersion developing. In puddle developing the resist-coated 102 substrate 103 is mounted onto a vacuum or mechanical chuck 104 that is on a rotary spindle. 105. Using a pipette 106 or any other means, the developer solution 101 is deposited onto the substrate surface and let sit for 30 seconds up to several minutes. After this period of time, the residual developer is spun off, and typically dionized (DI) water is sprayed onto the substrate to rinse the substrate during the spin step. Once rinsed, the DI water spray is shut off, and the substrate is allowed to spin dry. FIG. 10(*b*) illustrates spray developing. Again, a resist-coated 1010 substrate 1011 is mounted to a vacuum or mechanical chuck 1012 that is mounted to a rotary spindle 1013. While the substrate is spinning, developer 108 is sprayed onto the substrate use a spray nozzle 107 for a set period of time. Since the substrate is spinning, the solution developing the photoresist 109 is constantly being sheeted off of the substrate, and fresh developer is being sprayed on. After the developing stage, the rinse and dry stage is performed as for the puddle developing process. FIG. 10(*c*) illustrates the dip or immersion method of developing resist-coated substrates. A resist-coated substrate 1015, after being exposed, is secured to a holder 1014 by mechanical or vacuum means. This holder is immersed into a container 1016 the contains the photoresist developer such that the substrate is below the fluid line 1017. During the development process, the substrate is typically gently agitated in the developer solution. After the development time has expired, the substrate, still secured by the holder, is lifted out of the developer solution and into a container 1018 that has DI water for the rinse stage. Again, the substrate is dipped below the water level line 1019 and gently agitated for tens of seconds to rinse the resist surface. After the rinse stage, the substrate can be spun dry, or dried through the use of compressed air or nitrogen guns.

In order to create the microstructure desired using any of the coating, exposing, and developing methods described, one needs to determine what the manufacturing parameters required in order to achieve a desired developed depth in a particular photosensitive material. This response or contrast curve of the photosensitive material is a function of the exposure power, wavelength, incident polarization, and collimation, but it is also highly dependent upon the photosensitive material used, the substrate the material is coated onto, as well as the specific coating and development procedures. The index of reaction, both real and imaginary portions, in addition to the incident polarization and collimation of the radiation beam determine how much energy is transmitted into the photoresist film, and how much is absorbed. If the photoresist is coated onto a reflective substrate, then the film will be exposed to a higher energy dose due to increased back reflections. Changing coating parameters (e.g., softbake times and temperatures) or changing development parameters (e.g., developer solutions, times, and temperatures) will change the sensitivity of the photoresist, and therefore the developed depth.

Figure 11B:
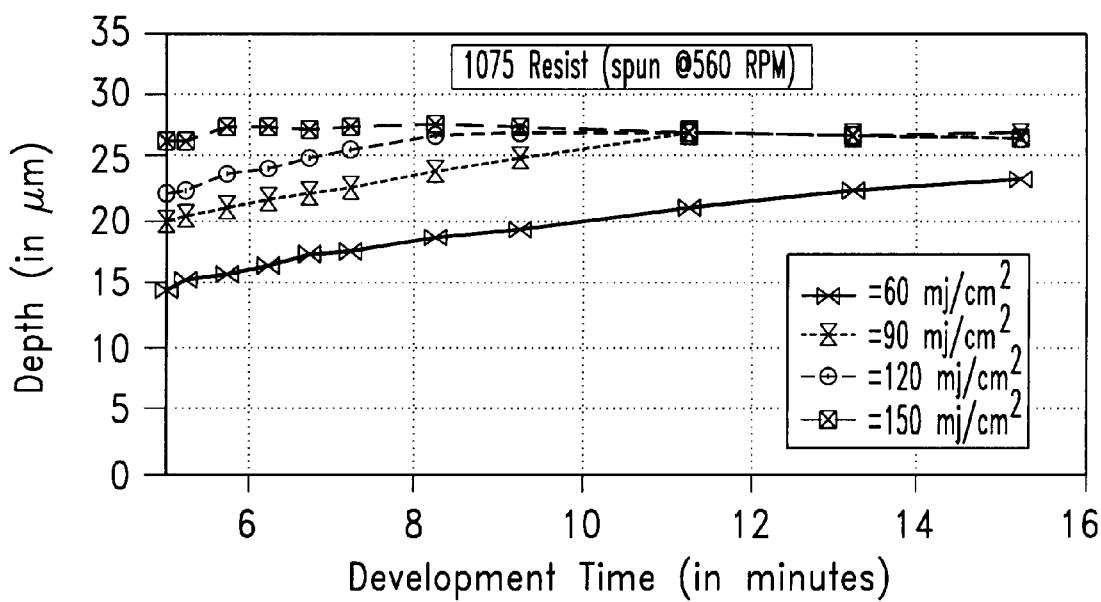

Once one has chosen a particular photosensitive material, a method for coating a surface with said material, a specific substrate material, exposure geometry, and a development method, one must conduct experiments to determine the response curves required in order to achieve specific continuous-relief surface profiles. FIG. 11(*a*) illustrates a response curve obtained for the exposure of Shipley 1075 photoresist to a LPG. The exposure parameters were such that $\lambda=0.4416$ $\mu$m radiation was used with a N.A.=0.6 objective. The resist was spin-coated at 560 rpm and softbaked at 90° C. for 10 minutes on a hotplate. The development procedure used was an immersion technique wherein the exposed substrate was developed in a solution of DI:Shipley 303A (8:1) for 2.5 minutes. The curve in FIG. 11(a) illustrates how exposure energies from 40 to 300 mJ/cm² result in photoresist depths that vary from 1 μm to 22 μm in depth. FIG. 11(b) illustrates how development depth varies as a function of development time. In this scenario substrates with about 27 μm of Shipley 1075 photoresist were exposed to RPC's laser pattern generator (same parameters as for FIG. 11(a)). The curves illustrate the development time (in a DI:Shipley 303A 8:1 solution) and energy in mJ/cm² required reach a specific depth in resist. Similar curves can be generated for other forms of exposure geometries, such as the grayscale lithography and translating mask exposure, as illustrated in FIG. 8 and 9, respectively. Data from curves such as those illustrated in FIG. 11 can be used to determine the proper exposure dose and development procedure to use, given a specific photosensitive material and coating procedure, to fabricate arbitrary microstructures.

FIG. 12 illustrates white-light surface profilometry data for a f/1 hyperbolic lens that was fabricated using its laser pattern generator. The sag of the surface in microns is illustrated versus the radial coordinate of the lens in microns. One can use profilometry data to determine how well the fabricated profile matches that of the desired profile. Deviations can be fixed most easily by changing the look-up table or exposure dose as a function of position on the substrate surface. In the example illustrated, one notes that the deviation between the fabricated and ideal surface is less than 0.5 μm, and that the total sag of the photoresist microlens is roughly 24 μm.

FIG. 13 illustrates optical profilometry data for a f/2 spherical microlens. In FIG. 13(a) the top-down contour map of the microlens is illustrated, while FIG. 13(b) illustrates a 3-D view of the surface. In FIG. 13(c) a line trace of the diagonal of the surface is depicted, illustrating a total surface sag of 23.2 μm. This microlens was patterned with a x-y LPG using Shipley 1075 photoresist.

Figure 14B:
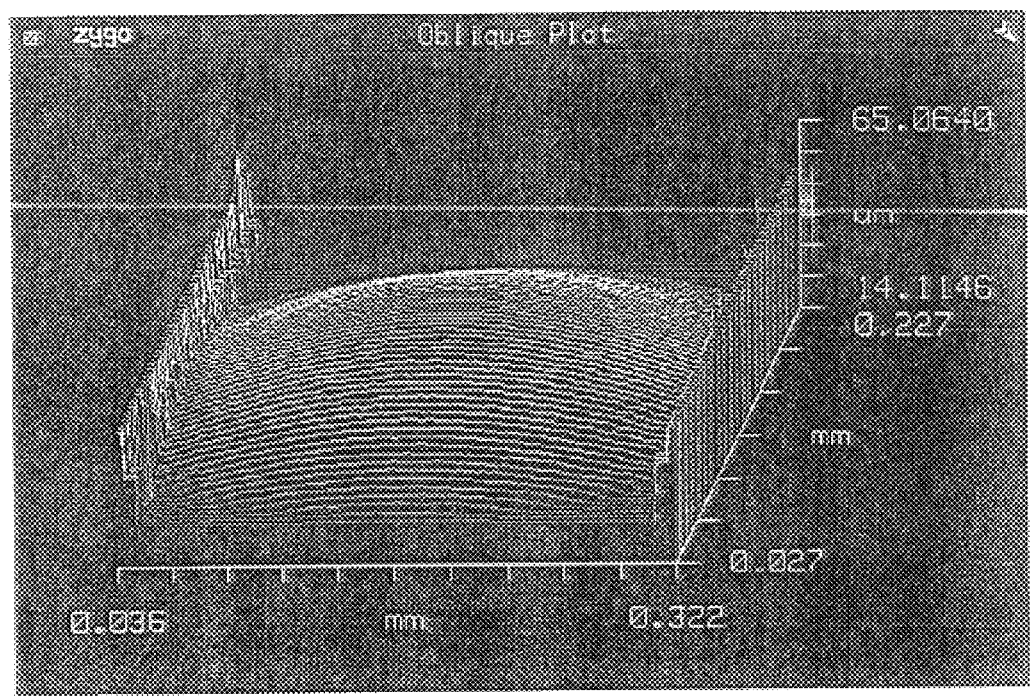
Figure 14C:
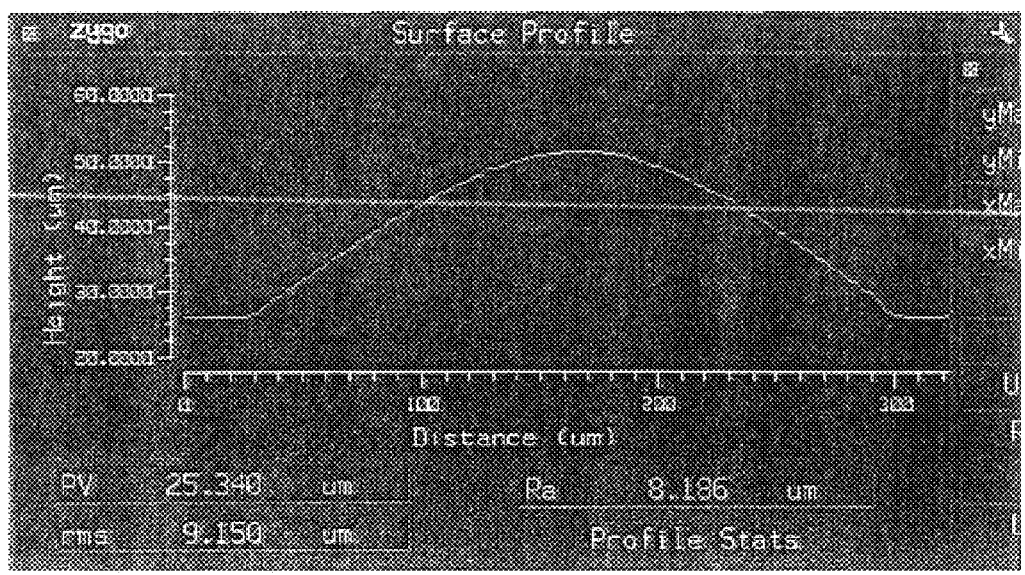

FIG. 14 illustrates optical profilometry data for a toroidal microlens that is f/1.5 is one direction and f/3 in the orthogonal direction. This microlens was patterned with a x-y LPG using Shipley 1075 photoresist. In FIG. 14(a) the top-down contour map of the microlens is illustrated. Note that for a toroidal microlens, the surface contour is oblong, illustrating the difference in optical power for the two orthogonal surface coordinates. In FIG. 14(b) a 3-D view of the surface is illustrated. In FIG. 14(c), a line trace of the diagonal of the surface is depicted, illustrating a total surface sag of 25.2 μm.

Figure 15A:
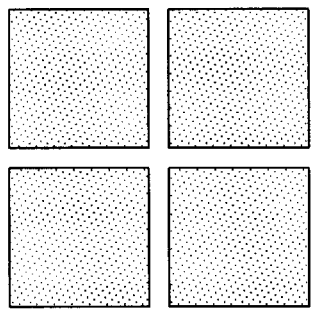
Figure 15B:
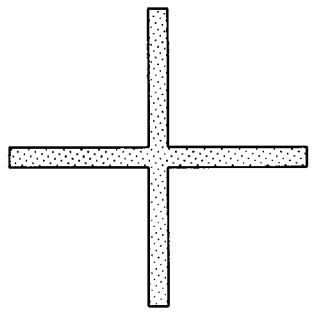
Figure 15C:
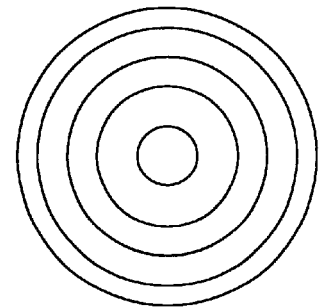

FIG. 15 illustrates possible alignment and registration marks that the method of the current invention allows one to simultaneously write in conjunction with the desired optical structures. These alignment marks are helpful for the wafer processing illustrated in FIG. 3(b) and 3(c), as well as in the alignment of the individual optical elements to the sources, fibers, or detectors they need to be integrated with. In FIG. 15(a) and 15(b) we illustrate an inverse cross and a cross that can be used to align two substrates with respect to each other using an optical microscope. In FIG. 15(c) we illustrate a diffractive microlens that can be used as part of a micro-interferometer in order to align optical elements using optical alignment schemes.

The foregoing is only an illustrative example, the invention extends to the exposure of a photosensitive material to varying doses of electromagnetic radiation, for the purposes of creating a multi-level or continuous-relief profile that exceed 15 μm. The exposure process can be conducted using laser pattern generation, grayscale lithography, etc.

From the foregoing description, it will be apparent that there has been provided an improved system for the fabrication of micro-optics (optical microstructures) of arbitrary relief patterns. Variations and modification in the herein described systems in accordance with this invention will undoubtedly suggest themselves to those skilled in the art. Accordingly, the foregoing description should be taken as illustrative, and not in a limiting sense.

What is claimed is:

1. A method for fabricating an optical microstructure on a substrate comprising the steps of:

coating the substrate with a photosensitive material to produce a photosensitive material coating to a height exceeding 15 μm;

producing a surface-relief microstructure pattern on the photosensitive material coating by a single-step exposure of the photosensitive material coating with a scanning beam of electromagnetic radiation, wherein said scanning beam is focused onto a portion of the photosensitive material where said pattern is to be formed, and said beam is multiply translated across said portion while changing its intensity with an optical modulator to provide a scanning beam having an exposure dosage varying with said translations over the photosensitive material coating to produce an optical microstructure pattern as a result of the photosensitive material coating responding to the electromagnetic radiation, wherein a width of said focused beam is smaller than a width of said pattern, and developing said exposed pattern in said photosensitive material to form an optical microstructure.

2. The method of claim 1 further comprising the step of:

exposing the photosensitive material coating to provide alignment marks or metrology marks or both simultaneously with the surface-relief microstructure pattern.

3. The method of claim 1 wherein the optical microstructure is a microlenses having a depth profile >15 μm.

4. The method of claim 1 wherein the optical modulator includes a laser pattern generator (LPG), and the single-step exposure is performed using the laser pattern generator (LPG) such that the exposure dosage is varied by modulating either the dwell time or the radiation power of the scanning beam.

5. The method of claim 4 wherein the photosensitive material is a photoresist and the laser pattern generator (LPG) is operated to focus the scanning beam into one or more focused spots that are scanned across the photoresist by translating the substrate, moving the one or more focused spots, or a combination thereof.

6. The method of claim 1 wherein the surface-relief microstructure pattern is a specified profile selected from a group consisting of spherical, aspherical, periodial, hyperbolic, parabolic, and ellipsoidal.

7. The method of claim 1 further comprising the step of:

transferring the surface-relief microstructure pattern into the underlying substrate using a process selected from the group consisting of wet chemical etching, dry chemical etching, ion milling, reactive ion etching, reactive ion beam etching, and chemical-assisted ion beam etching.

8. The method of claim 1 wherein the optical microstructure is a plurality of microlenses and the method further comprises the steps of:

developing and etching the surface-relief microstructure pattern to create a master element having a plurality of microstructure profiles;

providing a polymer material; and fabricating the plurality of microlenses in the polymer material using the master element by a process selected from the group consisting of cast-and-cure, embossing, compression molding, injection molding, and compression-injection molding.

9. The method of claim 1 wherein the photosensitive material is a photoresist, and the single-step exposure patterns the photoresist to a depth exceeding 15 $\mu$m to produce a photoresist mold for the surface-relief microstructure pattern, the surface-relief microstructure pattern being a microlens having a sag exceeding 15 $\mu$m.

10. The method of claim 1 wherein the single-step exposure is performed without multiple masks or thermal reflow.

11. The method of claim 1 wherein the optical microstructure is a microlens having a sag of at least 20 $\mu$m, and the microlens has a numerical aperture (NA) of at least 0.5.

12. A microlens fabricated in accordance with the method of claim 1.

13. The method of claim 1 wherein the photosensitive material is a photoresist.

14. The method of claim 13 wherein the step of providing the surface-relief microstructure pattern includes the step of:

developing the photoresist to provide a grayscale response so as to create a multilevel profile or a continuous-relief profile in the photoresist in a single exposure during which the beam is scanned over the substrate.

* * * * *